United States Patent
Son

(10) Patent No.: US 11,269,551 B2
(45) Date of Patent: Mar. 8, 2022

(54) SEMICONDUCTOR MEMORY DEVICE AND METHOD OF OPERATING THE SAME

(71) Applicant: SK hynix Inc., Gyeonggi-do (KR)

(72) Inventor: Ki Cheol Son, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 13 days.

(21) Appl. No.: 16/816,538

(22) Filed: Mar. 12, 2020

(65) Prior Publication Data

US 2021/0048960 A1 Feb. 18, 2021

(30) Foreign Application Priority Data

Aug. 13, 2019 (KR) .................. 10-2019-0099040

(51) Int. Cl.
*G06F 3/06* (2006.01)
*G11C 16/04* (2006.01)
*G11C 16/08* (2006.01)
*G11C 16/26* (2006.01)
*G06F 13/16* (2006.01)
*G11C 16/14* (2006.01)

(52) U.S. Cl.
CPC .......... *G06F 3/0659* (2013.01); *G06F 3/0604* (2013.01); *G06F 3/0673* (2013.01); *G06F 13/1668* (2013.01); *G11C 16/0483* (2013.01); *G11C 16/08* (2013.01); *G11C 16/26* (2013.01); *G11C 16/14* (2013.01)

(58) Field of Classification Search
CPC .... G06F 3/0659; G06F 3/0604; G06F 3/0673; G06F 13/1668; G11C 16/0483; G11C 16/08; G11C 16/26; G11C 16/14; G11C 5/025; G11C 7/1042; G11C 16/32; G11C 16/20; G11C 5/04; G11C 16/10
USPC ........................................................ 711/154
See application file for complete search history.

(56) References Cited

U.S. PATENT DOCUMENTS

| 2010/0124107 A1* | 5/2010 | Yoon .................. G11C 8/10 365/185.2 |
| 2014/0019676 A1* | 1/2014 | Huffman ............. G06F 12/0246 711/103 |
| 2016/0011779 A1* | 1/2016 | Lee ...................... G06F 3/0688 711/103 |

FOREIGN PATENT DOCUMENTS

| KR | 10-0967008 | 6/2010 |
| KR | 10-2016-0007972 | 1/2016 |

* cited by examiner

*Primary Examiner* — Fernando Hidalgo
(74) *Attorney, Agent, or Firm* — IP & T Group LLP

(57) ABSTRACT

A semiconductor memory device includes a memory cell array, a peripheral circuit, and a control logic. The memory cell array includes a plurality of planes. The peripheral circuit is configured to perform a plane interleaving operation for the plurality of planes. The control logic controls the peripheral circuit to reset an operation of at least one plane of the plurality of planes based on a type of an operation reset command received by the control logic.

19 Claims, 18 Drawing Sheets

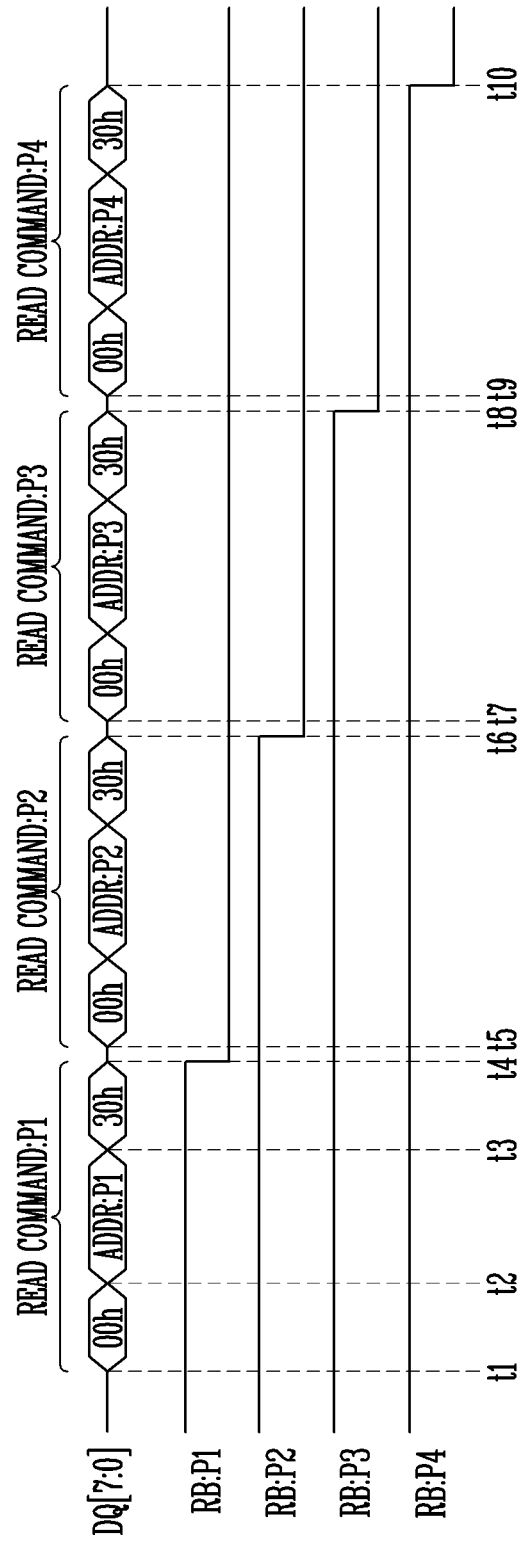

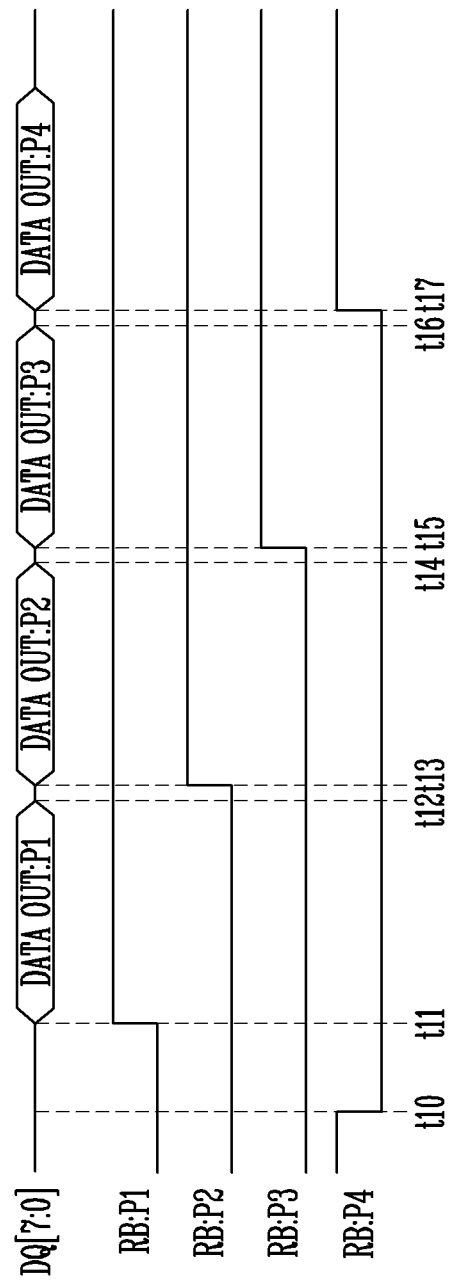

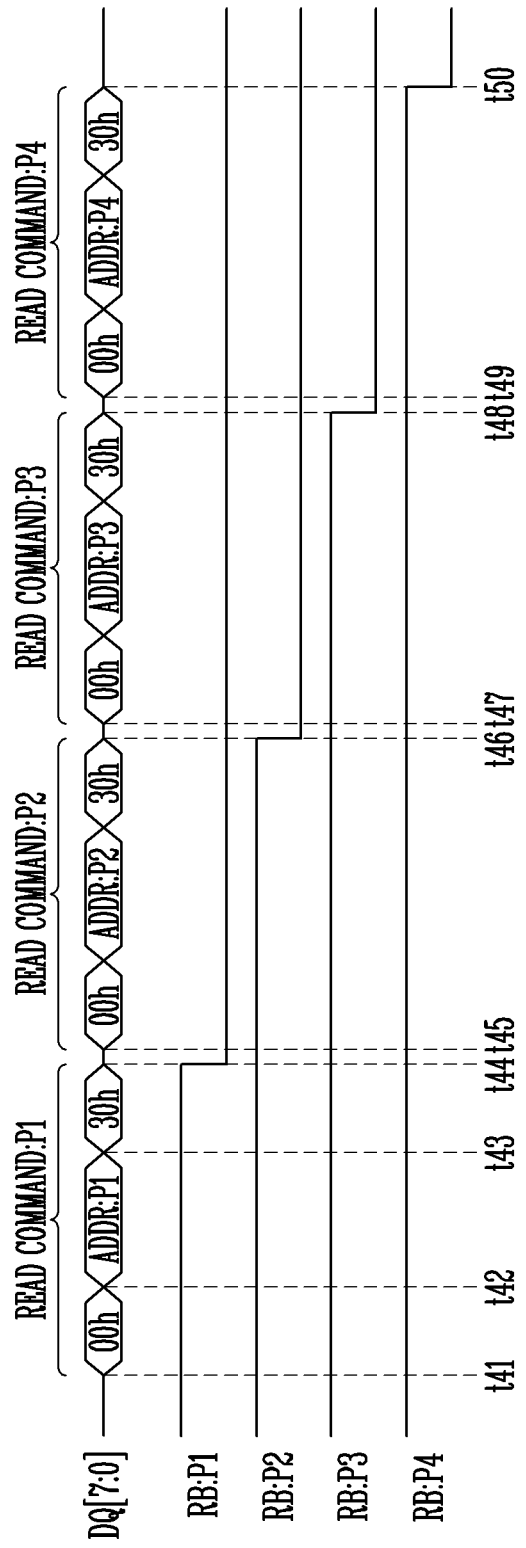

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2019-0099040, filed on Aug. 13, 2019, which is incorporated herein by reference in its entirety.

BACKGROUND

Field of Invention

The present disclosure relates to an electronic device, and more particularly to a semiconductor memory device and a method of operating the same.

Description of Related Art

A memory device may be formed in a two-dimensional structure in which strings are horizontally arranged on a semiconductor substrate, or in a three-dimensional structure in which strings are vertically stacked on a semiconductor substrate. The three-dimensional memory device is a memory device designed to solve a degree of integration limit of the two-dimensional memory device, and may include a plurality of memory cells stacked on a semiconductor substrate in a vertical direction.

SUMMARY

An embodiment of the present disclosure is to provide a semiconductor memory device having an improved operation speed and a method of operating the same.

A semiconductor memory device according to an embodiment of the present disclosure includes a memory cell array, a peripheral circuit, and a control logic. The memory cell array includes a plurality of planes. The peripheral circuit is configured to perform a plane interleaving operation for the plurality of planes. The control logic controls the peripheral circuit to reset the plane interleaving operation for at least one plane of the plurality of planes based on a type of an operation reset command received by the control logic.

According to an embodiment of the present disclosure, a method of operating a semiconductor memory device including a plurality of planes includes starting a plane interleaving operation for the plurality of planes, receiving an operation reset command from a controller, and resetting the plane interleaving operation for at least one plane of the plurality of planes, based on a type of the operation reset command.

According to an embodiment of the present disclosure, an operating method of a memory device for performing a plane interleaving operation on a plurality of planes included therein includes terminating, in response to a first command and an address indicating a selected plane, the plane interleaving operation on the selected plane while keeping the plane interleaving operation on remaining planes and performing, in response to a second command and the address provided after the termination, the plane interleaving operation on the selected plane after the plane interleaving operation on the remaining planes is completed. The plane interleaving operation in response to the second command is completed after completion of the plane interleaving operation on the remaining planes.

According to an embodiment of the present disclosure, a semiconductor memory device having an improved operation speed, and a method of operating the same may be provided.

BRIEF DESCRIPTION OF THE DRAWINGS

FIGS. 8A and 8B are timing diagrams illustrating a read operation according to a plane interleaving scheme.

FIGS. 10A and 10B are timing diagrams illustrating the operation of the semiconductor memory device when an individual-plane-reset command is received during the plane interleaving operation.

DETAILED DESCRIPTION

The advantages and features of the present disclosure, and a method of accomplishing the advantages and features will be described through embodiments that are described in detail below together with the accompanying drawings. However, the present disclosure is not limited to the embodiments described herein but may be embodied in other forms. The present embodiments are provided to describe the technical spirit of the present disclosure in detail to those skilled in the art to which the present disclosure pertains so that those skilled in the art may easily implement the technical spirit of the present disclosure.

Throughout the specification, in a case in which a portion is "connected" to another portion, the case includes not only a case in which the portion is "directly connected" to the other portion but also a case in which the portion is "indirectly connected" to the other portion with another element interposed therebetween. Throughout the specification, in a case in which a portion includes an element, the case means that the portion may include other elements without excluding other elements unless specifically stated otherwise.

Hereinafter, preferred embodiments of the present disclosure will be described in detail with reference to the accompanying drawings. At this time, it should be noted that, in the accompanying drawings, the same components are denoted by the same reference symbols when possible. In addition, the detailed description of well-known functions and configurations which may obscure the gist of the present disclosure will be omitted.

Figure 1:
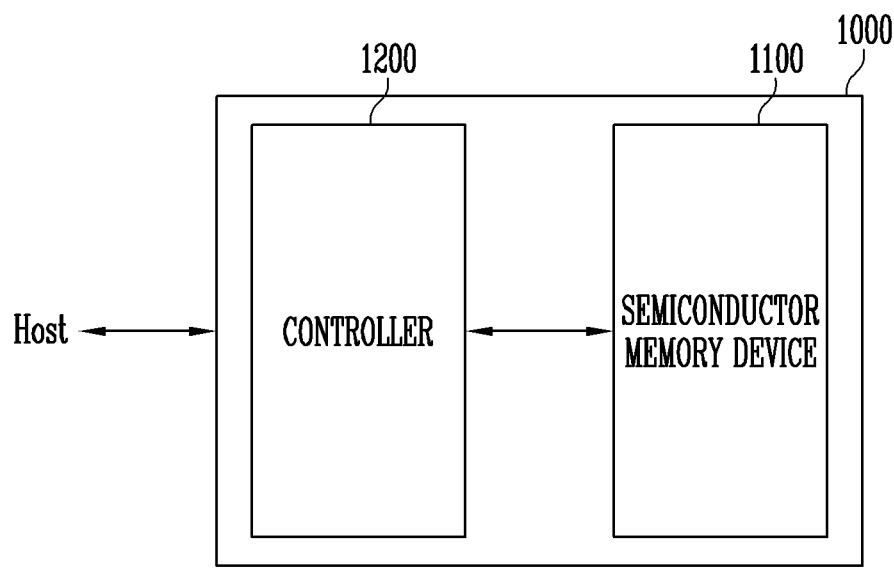
FIG. 1 is a diagram for describing a memory system.

FIG. 1 is a diagram for describing a memory system.

Referring to FIG. 1, the memory system 1000 may include a semiconductor memory device 1100 in which data is stored, and a controller 1200 that controls the semiconductor memory device 1100 under control of a host Host.

The host 300 may communicate with the memory system 1000 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The semiconductor memory device 1100 may be implemented as a volatile memory device in which data is lost when the power supply is cut off or a non-volatile memory device in which data is maintained even though the power supply is cut off. The semiconductor memory device 1100 may perform a program operation, a read operation, or an erase operation under the control of the controller 1200. For example, during a program operation, the semiconductor memory device 1100 may receive a command, an address, and data from the controller 1200 and perform a program operation. During the read operation, the semiconductor memory device 1100 may receive a command and an address from the controller 1200, and output read data to the controller 1200. To this end, the semiconductor memory device 1100 may include an input/output circuit for inputting and outputting data.

The controller 1200 may generally control an operation of the memory system 1000 and may control data exchange between the host and the semiconductor memory device 1100. For example, the controller 1200 may control the semiconductor memory device 1100 according to a request of the host to program, read, or erase data. In addition, the controller 1200 may receive data and a logical address from the host, and convert the logical address into a physical address indicating an area where data is actually stored in the semiconductor memory device 1100.

The controller 1200 may generate a command according to the requests received from the host. More specifically, the semiconductor memory device 1100 may include a plurality of planes, and the controller 1200 may control a plane interleaving operation of the semiconductor memory device 1100 including the plurality of planes, based on the request from the host. A plane interleaving operation may be any memory-access operation according to a plane interleaving scheme. For example, a read operation performed on the plurality of planes according to the plane interleaving scheme may be the plane interleaving operation. The controller 1200 may generate a read command to interleave and read data of different planes, based on the plurality of read requests received from the host, and transfer the read command to the memory device 1100. The memory device 1100 may perform the plane interleaving operation when performing the read operation for the plurality of planes, based on the read command. The plane interleaving operation for the read operation will be described later with reference to FIGS. 8A and 8B.

Figure 2:
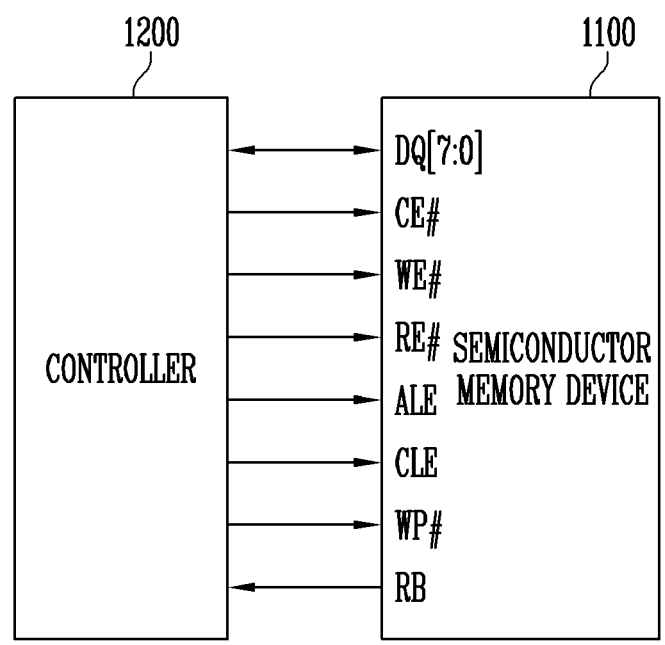
FIG. 2 is a diagram illustrating signals exchanged between a controller and a semiconductor memory device.

FIG. 2 is a diagram illustrating signals exchanged between the controller 1200 and the semiconductor memory device 1100. Referring to FIG. 2, the controller 1200 and the semiconductor memory device 1100 may exchange a command, data, or an address through DQ[7:0] pad. Meanwhile, the semiconductor memory device may receive a chip enable signal, a write enable signal, a read enable signal, an address latch enable signal, and a command latch enable signal, a write protection signal, and the like through CE#, WE#, RE#, ALE, CLE, and WP# pads, respectively. In addition, the semiconductor memory device 1100 may output a ready busy signal through an RB pad. When the semiconductor memory device 1100 includes the plurality of planes, the semiconductor memory device 1100 may output a plurality of ready busy signals corresponding to the respective planes.

Figure 3:
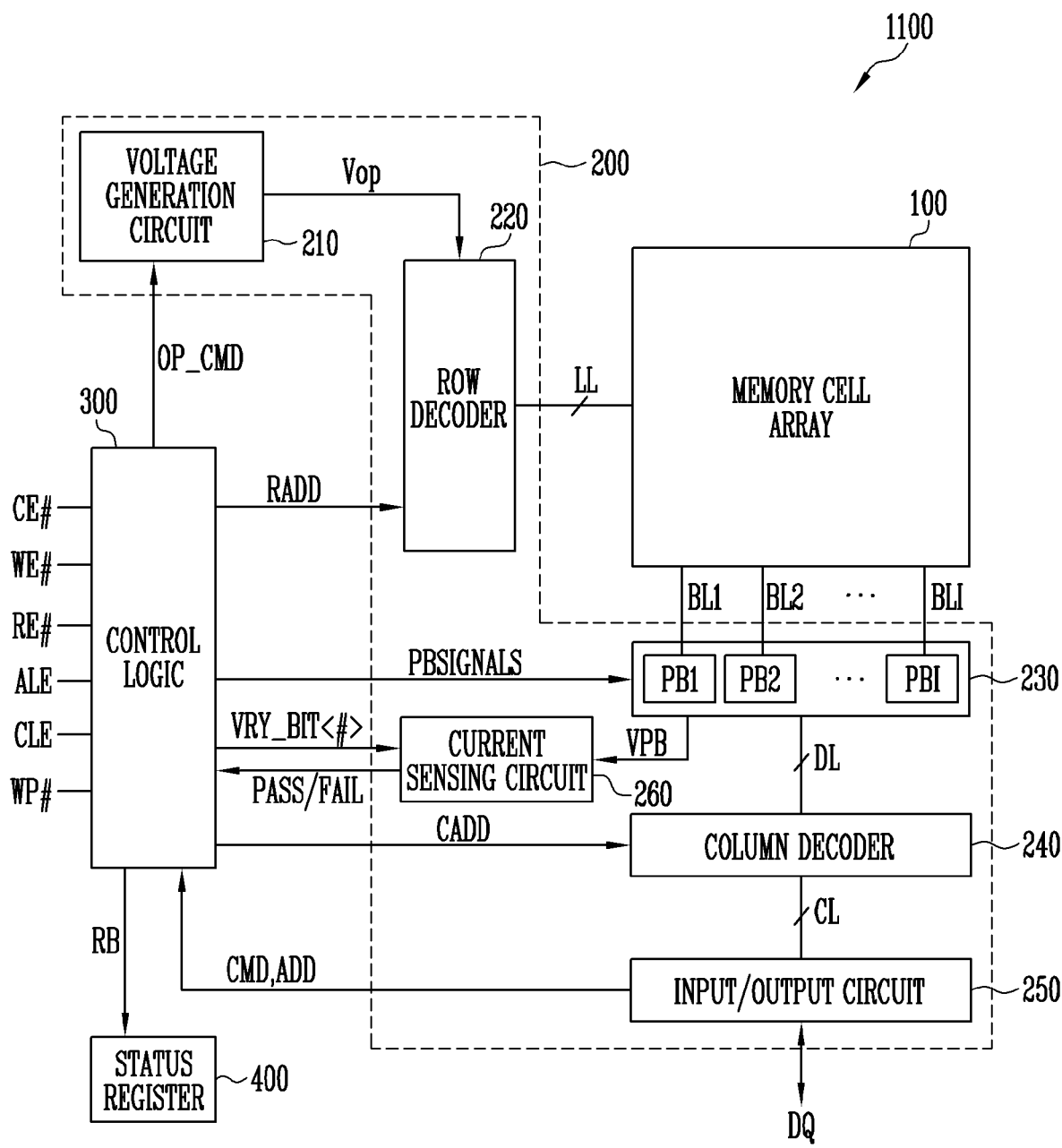
FIG. 3 is a diagram for describing a semiconductor memory device, such as that shown in FIGS. 1 and 2.

FIG. 3 is a diagram for describing the semiconductor memory device of FIGS. 1 and 2.

Referring to FIG. 3, the semiconductor memory device 1100 may be implemented as a volatile memory device or a non-volatile memory device. In FIG. 3, a non-volatile memory device is shown as an embodiment, but the present embodiment is not limited to the non-volatile memory device.

The semiconductor memory device 1100 may include a memory cell array 100 in which data is stored. The semiconductor memory device 1100 may include peripheral circuits 200 configured to perform a program operation for storing data in the memory cell array 100, a read operation for outputting the stored data, and an erase operation for erasing the stored data. The semiconductor memory device 1100 may include a control logic 300 that controls the peripheral circuits 200 under control of the controller (1200 of FIG. 2). In addition, the semiconductor memory device 1100 may include a state register 400 indicating an operation state of the semiconductor memory device 1100.

The memory cell array 100 includes a plurality of memory cells in which data is stored. For example, the memory cell array 100 may include one or more planes, each of the planes may include one or more memory blocks. Each of the memory blocks may include a plurality of memory cells. A structure including a plurality of planes may be referred to as a multi-plane structure. User data and various pieces of information necessary for the operation of the semiconductor memory device 1100 may be stored in the memory blocks. The memory blocks may be implemented in a two-dimensional or three-dimensional structure. Memory blocks of the three-dimensional structure are mainly used to improve a degree of integration. The memory blocks having the two-dimensional structure may include memory cells arranged parallel to a substrate, and memory blocks having the three-dimensional structure may include memory cells stacked vertically on the substrate.

The peripheral circuits 200 may be configured to perform the program, read, and erase operations according to the control of the control logic 300. For example, the peripheral circuits 200 may include a voltage generation circuit 210, a row decoder 220, a page buffer group 230, a column decoder 240, an input/output circuit 250, and a current sensing circuit 260.

The voltage generation circuit 210 may generate various operation voltages Vop used for the program, read, and erase operations, in response to an operation signal OP_CMD output from the control logic 300. For example, the voltage generation circuit 210 may generate various voltages, such as a program voltage, a verify voltage, a pass voltage, a read voltage, and an erase voltage, under the control of the control logic 300.

The row decoder 220 may transfer the operation voltages Vop to local lines LL connected to a selected memory block among the memory blocks of the memory cell array 100, in response to a row address RADD. The local lines LL may include local word lines, local drain select lines, and local source select lines. In addition, the local lines LL may include various lines connected to the memory block, such as a source line.

The page buffer group 230 may be connected to bit lines BL1 to BLI which are connected to the memory blocks of the memory cell array 100. The page buffer group 230 may include a plurality of page buffers PB1 to PBI connected to the bit lines BL1 to BLI. The page buffers PB1 to PBI may operate in response to page buffer control signals PBSIG-NALS. For example, the page buffers PB1 to PBI may temporarily store data received through the bit lines BL1 to BLI, or may sense a voltage or a current of the bit lines BL1 to BLI during the read or verify operation.

The column decoder 240 may transfer data between the input/output circuit 250 and the page buffer group 230 in response to a column address CADD. For example, the column decoder 240 may exchange data with the page buffers PB1 to PBI through data lines DL, or exchange data with the input/output circuit 250 through the column lines CL.

The input/output circuit 250 may receive a command CMD, an address ADD, and data from the controller 1200 of FIG. 1 through an input/output pad DQ, and output the read data to the controller 1200 through the input/output pad DQ. For example, the input/output circuit 250 may transfer the command CMD and the address ADD received from the controller 1200 to the control logic 300 or exchange data DATA with the column decoder 240.

The current sensing circuit 260 may generate a reference current in response to a permission bit VRY_BIT<#> in a read operation or a verify operation, compare a sensing voltage received from the page buffer group 230 with a reference voltage generated by the reference current, and output a pass signal PASS or a fail signal FAIL.

The control logic 300 may receive the command CMD and the address ADD in response to the signals received through the CE#, WE#, RE#, ALE, CLE, and WP# pads. The control logic 300 may output the operation signal OP_CMD, the row address RADD, the page buffer control signals PBSIGNALS, and the permission bit VRY_BIT<#> in response to the command CMD and the address ADD to control the peripheral circuits 200. The control logic 300 may determine whether the verify operation passes or fails in response to the pass signal PASS or the fail signal FAIL.

The state register 400 may store data indicating whether the semiconductor memory device 1100 is in a ready state or a busy state based on the ready busy signal RB received from the control logic 300. The data may be transferred to the controller 1200 through the RB pad as the ready busy signal. When the memory cell array 100 has a multi-plane structure including a plurality of planes, the state register 400 may output a ready busy signal corresponding to each plane.

Figure 4:
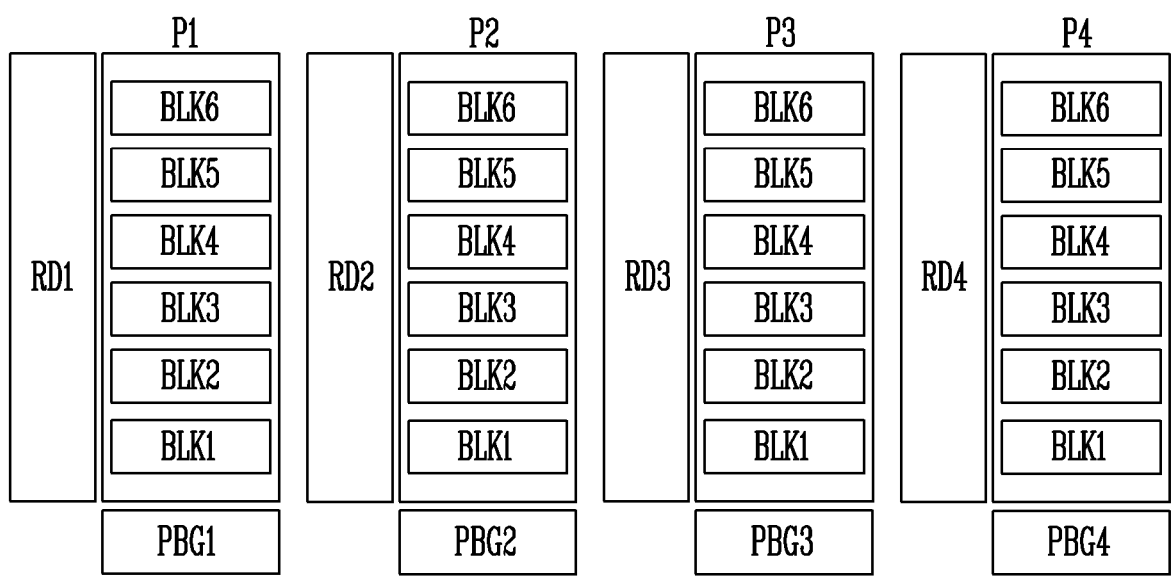
FIG. 4 is a diagram for describing a multi-plane structure.

FIG. 4 is a diagram for describing a multi-plane structure.

Referring to FIG. 4, a semiconductor memory device 1100 having a multi-plane structure may include a plurality of planes P1 to P4.

For example, the first to fourth planes P1 to P4 may be included in one semiconductor memory device 1100. Although four planes are shown in FIG. 4, the number of planes is not limited thereto.

Row decoders RD1 to RD4 and page buffer groups PBG1 to PBG4 may be connected to the first to fourth planes P1 to P4, respectively, and the first to fourth planes P1 to P4 may operate independently. For example, the first plane P1 may be connected to the first row decoder RD1 and the first page buffer group PBG1 and may be operated independently, the second plane P2 may be connected to the second row decoder RD2 and the second page buffer group PBG2 and may be operated independently, and the third plane P3 may be connected to the third row decoder RD3 and the third page buffer group PBG3 and may be operated independently, and the fourth plane P4 may be connected to the fourth row decoder RD4 and the fourth page buffer group PBG4 and may be operated independently. All of the first to fourth row decoders RD1 to RD4 and the first to fourth page buffer groups PBG1 to PBG4 may be controlled by the control logic 300 of FIG. 2, and the first to fourth planes P1 to P4 may operate simultaneously.

For example, in the read operation, each of the first to fourth row decoders RD1 to RD4 may apply a read voltage to a memory block selected from each of the first to fourth planes P1 to P4 in response to the received row address. The first to fourth page buffer groups PBG1 to PBG4 may temporarily store read data by sensing a voltage or a current of bit lines connected to the first to fourth planes P1 to P4. When all the sensing operations of the first to fourth planes P1 to P4 are completed, the read data temporarily stored in the first to fourth page buffer groups PBG1 to PBG4 may be sequentially output through the input/output circuits 250 of FIG. 2. For example, after the read data of the first page buffer group PBG1 is first output, the read data of the second to fourth page buffer groups PBG2 to PBG4 may be sequentially output. Such a multi-plane read operation will be described later with reference to FIG. 14.

Each of the plurality of planes may include a plurality of memory blocks. In order to process operations for each memory block in parallel, a multi-plane operation of simultaneously processing operations for the plurality of planes may be performed. In an embodiment, the plane may be a unit of a memory area that may be simultaneously accessed when a program, read, or erase operation is performed. Therefore, in the multi-plane structure in which the semiconductor memory device 1100 includes the plurality of planes, the semiconductor memory device 1100 may simultaneously perform an erase, read, or program operation on blocks or pages positioned in different planes.

According to an embodiment of the present disclosure, the controller 1200 may control the read operation for the plurality of planes included in the semiconductor memory device 1100. For example, the controller 1200 may provide read commands for different planes to the semiconductor memory device 1100 such that the semiconductor memory device 1100 performs a plane interleaving operation during the read operation. Meanwhile, the controller 1200 may provide the semiconductor memory device 1100 with a command for resetting the plane interleaving operation of the semiconductor memory device 1100, which is being currently implemented.

For example, the controller 1200 may provide the semiconductor memory device 1100 with an all-plane-reset command for resetting the plane interleaving operation for all planes of the semiconductor memory device 1100. The semiconductor memory device 1100 may stop the plane interleaving operation for all planes based on the received all-plane-reset command.

In another example, the controller 1200 may provide the semiconductor memory device 1100 with an individual-plane-reset command for resetting the plane interleaving operation on a selected plane corresponding to the individual-plane-reset command. In this case, a plane address indicating the selected plane to which the plane interleaving operation is to be reset may be provided to the semiconductor memory device 1100 together with the individual-plane-reset command. The semiconductor memory device 1100 may stop the plane interleaving operation for a selected plane among the plurality of planes included in the memory cell array 100, based on the individual-plane-reset command and the plane address indicating the selected plane.

Therefore, according to the needs of the controller 1200, the plane interleaving operation for all planes or for a selected plane may be reset during the plane interleaving operation. Thus, the operation of the semiconductor memory device 1100 may be more efficiently controlled.

Figure 5:
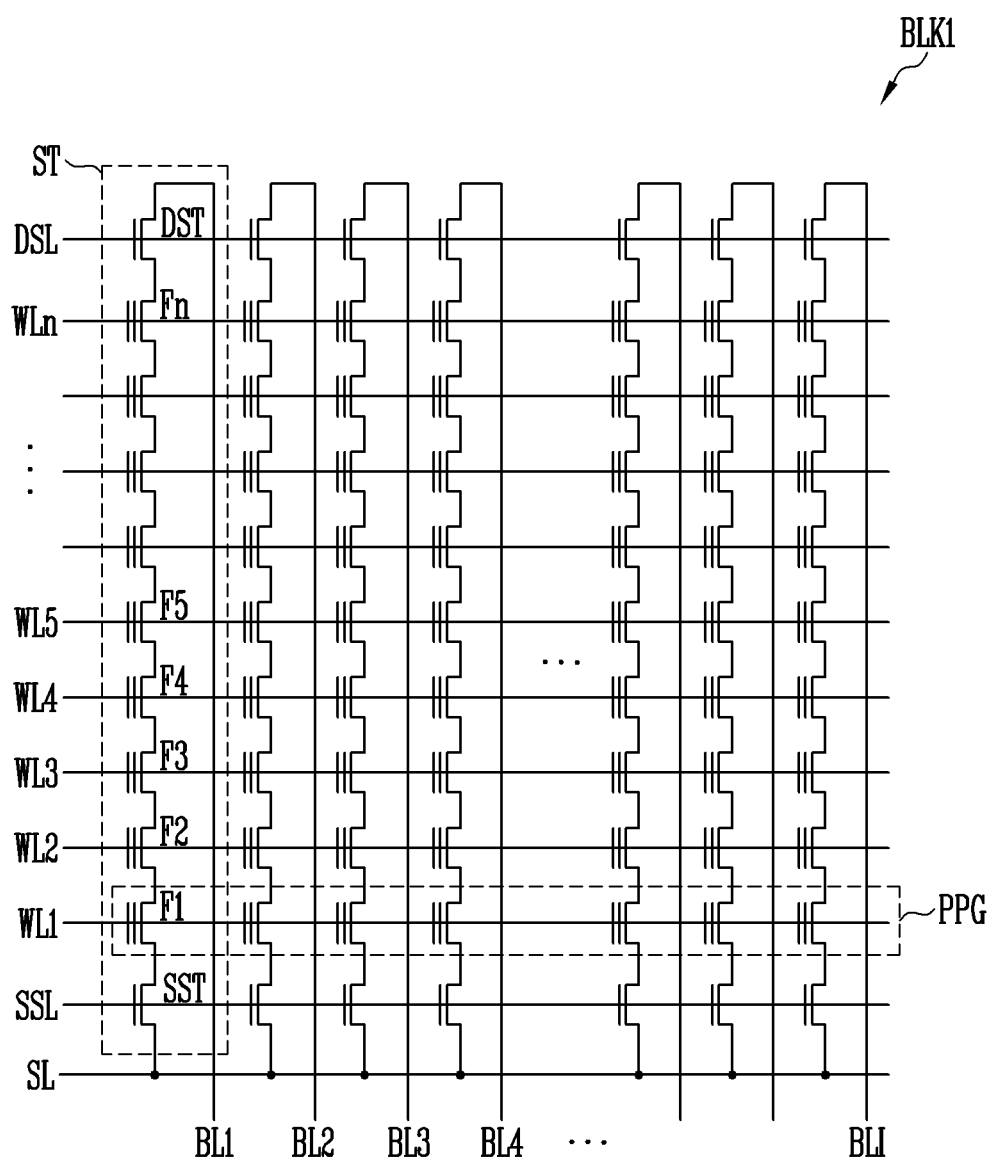
FIG. 5 is a diagram for describing a memory block, such as that shown in FIG. 4.

FIG. 5 is a diagram for describing the memory block of FIG. 4.

Referring to FIG. 5, since the plurality of memory blocks BLK1 to BLK6 shown in FIG. 4 may be configured substantially similar to each other, only the first memory block BLK1 will be described as an example.

The first memory block BLK1 may include a plurality of cell strings ST connected between bit lines BL1 to BLI and a source line SL. For example, the cell strings ST may be connected to the bit lines BL1 to BLI, respectively, and may be commonly connected to the source line SL. Since the cell strings ST are configured similarly to each other, a string ST connected to the first bit line BL1 will be described as an example which follows.

The cell string ST may include a source select transistor SST, first to n-th memory cells F1 to Fn (n is a positive integer), and a drain select transistor DST connected in series between the source line SL and the first bit line BL1. The number of source and drain select transistors SST and DST is not limited to the number shown in FIG. 4. The source select transistor SST may be connected between the source line SL and the first memory cell F1. The first to n-th memory cells F1 to Fn may be connected in series between the source select transistor SST and the drain select transistor DST. The drain select transistor DST may be connected between the n-th memory cell Fn and the first bit line BL1. Although not shown in the drawing, dummy cells may be further connected between the memory cells F1 to Fn or between the source select transistor SST and the drain select transistor DST.

Gates of the source select transistors SST included in the different cell strings ST may be connected to a source select line SSL, gates of the first to n-th memory cells F1 to Fn may be connected to first to n-th word lines WL1 to WLn, and gates of the drain select transistors DST may be connected to drain select lines DSL. Here, a group of memory cells connected to the word lines WL1 to WLn, respectively, is referred to as a page PG. For example, a group of the first memory cells F1 connected to the first word line WL1 among the memory cells F1 to Fn included in the different cell strings ST may be one physical page PPG. The program and read operations may be performed in a unit of the physical page PPG.

Figure 6:
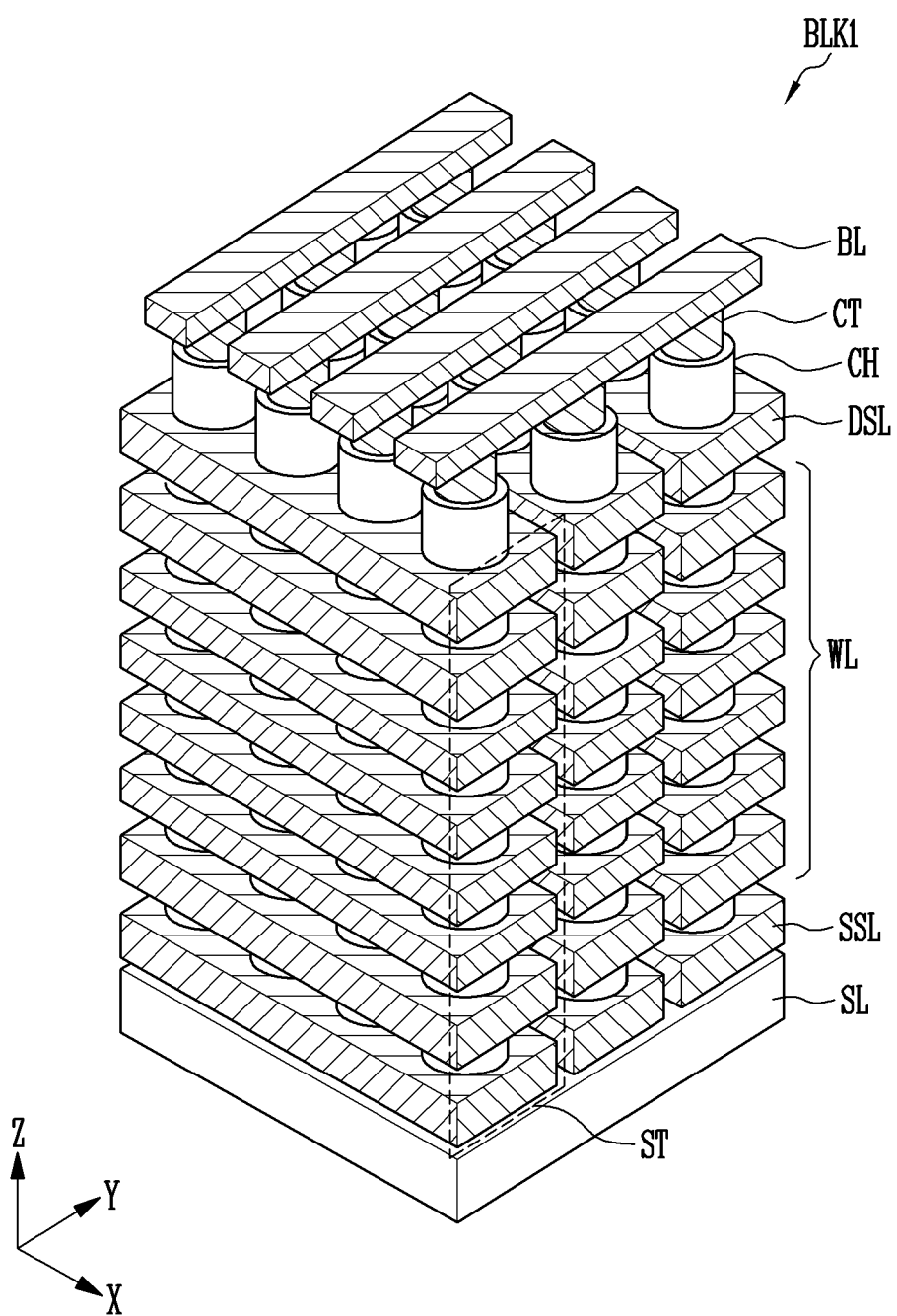
FIG. 6 is a diagram for describing an embodiment in which the memory block of FIG. 5 is configured in three dimensions.

FIG. 6 is a diagram for describing an embodiment in which the memory block of FIG. 5 is configured in three dimensions.

Referring to FIG. 6, the memory block BLK1 implemented in a three-dimensional structure may be formed in a vertical (Z direction) I shape on a substrate, and may include the plurality of cell strings ST arranged between the bit lines BL and the source line SL. Alternatively, a well may be formed instead of the source line SL. Such a structure is also referred to as bit cost scalable (BiCS). For example, when the source line SL is horizontally formed on the substrate, the cell strings ST having the BiCS structure may be formed in the vertical direction (Z direction) on the source line SL.

More specifically, the cell strings ST may be arranged in each of a first direction (X direction) and a second direction (Y direction). The cell strings ST may include the source select lines SSL, the word lines WL, and the drain select lines DSL that are stacked and spaced apart from each other. The number of the source select lines SSL, word lines WL, and drain select lines DSL is not limited to the number shown in the drawings, and may be different according to the semiconductor memory device 1100. The cell strings ST may include a vertical channel film CH vertically penetrating the source select lines SSL, the word lines WL, the drain select lines DSL, and the bit lines BL which are in contact with an upper portion of the vertical channel film CH protruded to an upper portion of the drain select lines DSL and extend in the second direction (Y direction). The memory cells may be formed between the word lines WL and the vertical channel films CH. A contact plug CT may be further formed between the bit lines BL and the vertical channel films CH.

Figure 7:
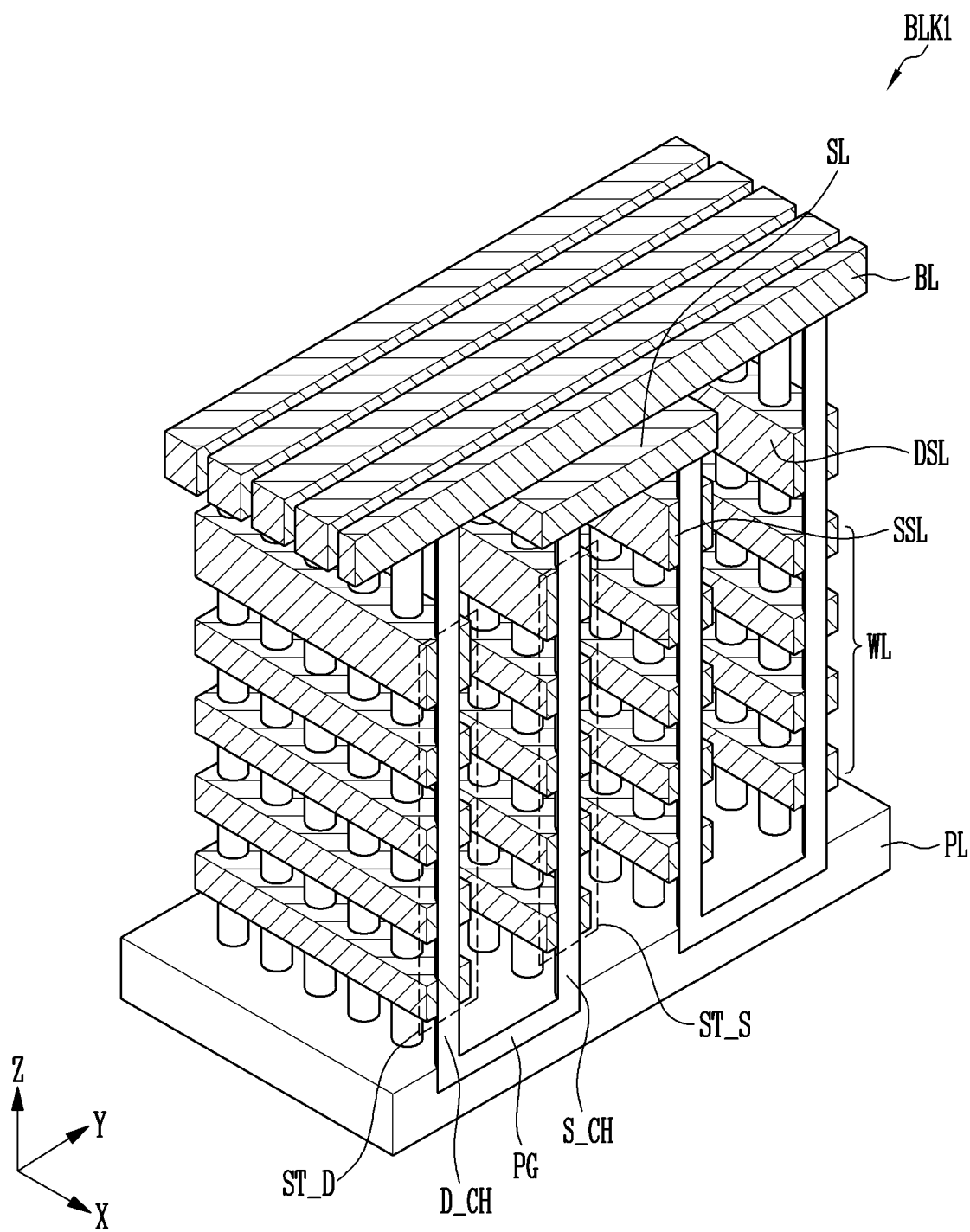
FIG. 7 is a diagram for describing another embodiment in which the memory block of FIG. 4 is configured in three dimensions.

FIG. 7 is a diagram for describing another embodiment in which the memory block of FIG. 4 is configured in three dimensions.

Referring to FIG. 7, the first memory block BLK1 implemented in a three-dimensional structure may be formed in a U shape of a vertical direction (Z direction) on a substrate, and may include a pair of source strings ST_S and drain strings ST_D connected between the bit lines BL and the source lines SL. The source strings ST_S and the drain strings ST_D may be connected to each other through a pipe gate PG to form a U-shaped structure. The pipe gate PG may be formed in a pipeline PL. Specifically, the source strings ST_S may be vertically formed between the source lines SL and the pipeline PL, and the drain strings ST_D may be vertically formed between the bit lines BL and the pipeline PL. Such a structure is also referred to as pipe-shaped bit cost scalable (P-BiCS).

More specifically, the drain strings ST_D and the source strings ST_S may be arranged in the first direction (X direction) and the second direction (Y direction), respectively, and the drain strings ST_D and the source strings ST_S may be alternately arranged along the second direction Y. The drain strings ST_D may include the word lines WL and the drain select lines DSL that are stacked and spaced apart from each other, and drain vertical channel films D_CH vertically passing through the word lines WL and the drain select lines DSL. The source strings ST_S may include the word lines WL and the source select lines SSL that are stacked and spaced apart from each other, and source vertical channel films S_CH vertically passing through the word lines WL and the source select lines SSL. The drain vertical channel films D_CH and the source vertical channel films S_CH may be connected to each other by the pipe gate PG in the pipeline PL. The bit lines BL may be in contact with an upper portion of the drain vertical channel films D_CH protruded to an upper portion of the drain select line DSL and may extend in the second direction (Y direction).

The first memory block BLK1 may be implemented in various structures in addition to the structures described with reference to FIGS. 5 to 7.

FIGS. 8A and 8B are timing diagrams illustrating a read operation according to a plane interleaving scheme.

Referring to FIGS. 8A and 8B, the command received through the DQ[7:0] pad shown in FIG. 2, data output through the DQ[7:0] pad, and the ready busy signal output through the RB pad, are shown. The ready busy signal output through the RB pad may indicate a ready state or a busy state for each of the planes P1, P2, P3, and P4 included in the semiconductor memory device 1100. As described above, the ready busy signal may be output from the state register 400 shown in FIG. 2 to the controller 1200 through the RB pad.

At a time point t1, the semiconductor memory device 1100 may receive a first page-read command through the DQ[7:0] pad. In an embodiment, the first page-read command may be illustrated as 00h in FIG. 8A. Thereafter, at a time point t2, the semiconductor memory device 1100 may receive an address ADDR indicating a page to be read through the DQ[7:0] pad. The address ADDR received at the time point t2 may be an address indicating the first plane P1. At a time point t3, the semiconductor memory device 1100 may receive a second page-read command through the DQ[7:0] pad. In an embodiment, the second page-read command may be indicated as 30h. The first page-read command 00h, the page address ADDR:P1, and the second page-read command 30h received between the time points t1 and t4 may configure a read command for the first plane P1.

As the second page-read command 30h is received, a read operation for the first plane P1 is started. Therefore, at a time point t4, the ready busy signal RB:P1 of the first plane P1 is changed from a high value indicating the ready state to a low value indicating the busy state.

At a time point t5, the semiconductor memory device 1100 may receive the first page-read command 00h through the DQ[7:0] pad, and receive an address ADDR:P2 corresponding to the page included in the second plane P2, and the second page-read command 30h. The first page-read command 00h, the page address ADDR:P2, and the second page-read command 30h received between the time points t5 and t6 may configure a read command for the second plane P2.

As the second page-read command 30h is received, a read operation for the second plane P2 is performed. Therefore, at a time point t6, the ready busy signal RB:P2 of the second plane P2 is changed from the high value indicating the ready state to the low value indicating the busy state.

At a time point t7, the semiconductor memory device 1100 may receive the first page-read command 00h through the DQ[7:0] pad, and receive an address ADDR:P3 corresponding to the page included in the third plane P3, and the second page-read command 30h. The first page-read command 00h, the page address ADDR:P3, and the second page-read command 30h received between the time points t7 and t8 may configure a read command for the third plane P3.

As the second page-read command 30h is received, a read operation for the third plane P3 is performed. Therefore, at a time point t8, the ready busy signal RB:P3 of the third plane P3 is changed from the high value indicating the ready state to the low value indicating the busy state.

At a time point t9, the semiconductor memory device 1100 may receive the first page-read command 00h through the DQ[7:0] pad, and receive an address ADDR:P4 corresponding to the page included in the fourth plane P4, and the second page-read command 30h. The first page-read command 00h, the page address ADDR:P4, and the second page-read command 30h received between the time points t9 and t10 may configure a read command for the fourth plane P4.

As the second page-read command 30h is received, a read operation for the fourth plane P4 is performed. Therefore, at a time point t10, the ready busy signal RB:P4 of the fourth plane P4 is changed from the high value indicating the ready state to the low value indicating the busy state.

Referring to FIG. 8B (after time point t10 of FIG. 8A), at a time point t11, the read operation for the first plane P1 is completed. Therefore, at the time point t11, the ready busy signal RB:P1 of the first plane P1 is changed from the low value to the high value. Meanwhile, the semiconductor memory device 1100 may output read data for the first plane through the DQ[7:0] pad between the time points t11 and t12 (DATA OUT:P1).

Thereafter, at a time point t13, the read operation for the second plane P2 is completed. Therefore, at the time point t13, the ready busy signal RB:P2 of the second plane P2 is changed from the low value to the high value. Meanwhile, the semiconductor memory device 1100 may output read data for the second plane through the DQ[7:0] pad between the time points t13 and t14 (DATA OUT:P2).

The read operation for the second plane P2 may be completed before the time point t12. However, in this case, the data output operation DATA OUT:P2 for the second plane P2 may be started after the data output operation for the first plane P1 is completed.

Similarly, a data output operation DATA OUT:P3 for the third plane P3 is performed between the time points t15 and t16, and a data output operation DATA OUT:P4 for the fourth plane P4 is performed after a time point t17.

As shown in FIGS. 8A and 8B, in the multi-plane structure including the plurality of planes, the semiconductor memory device may start a read operation for a subsequent plane (for example, P2) in response to a read command for the subsequent plane while a read operation is being performed for a previous plane (for example, P1). Such a scheme of the memory-access operation (e.g., a read operation), as described with reference to FIGS. 8A and 8B, is referred to as the plane interleaving scheme. For example, a read operation performed on the plurality of planes according to the plane interleaving scheme, as described with reference to FIGS. 8A and 8B, may be the plane interleaving operation. Therefore, the read operation may be performed on the plurality of planes in a pipelined way, and thus the operation speed of the semiconductor memory device is improved.

Figure 9A:
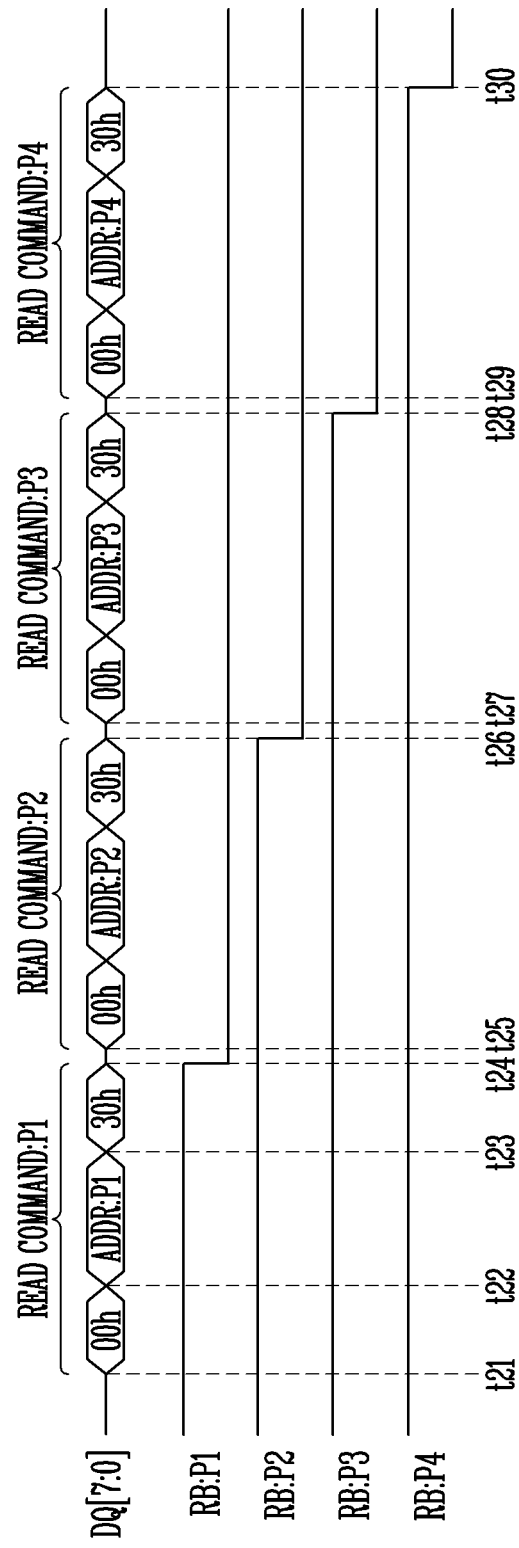
FIGS. 9A and 9B are timing diagrams illustrating an operation of the semiconductor memory device when an all-plane-reset command is received during a plane interleaving operation.
Figure 9B:
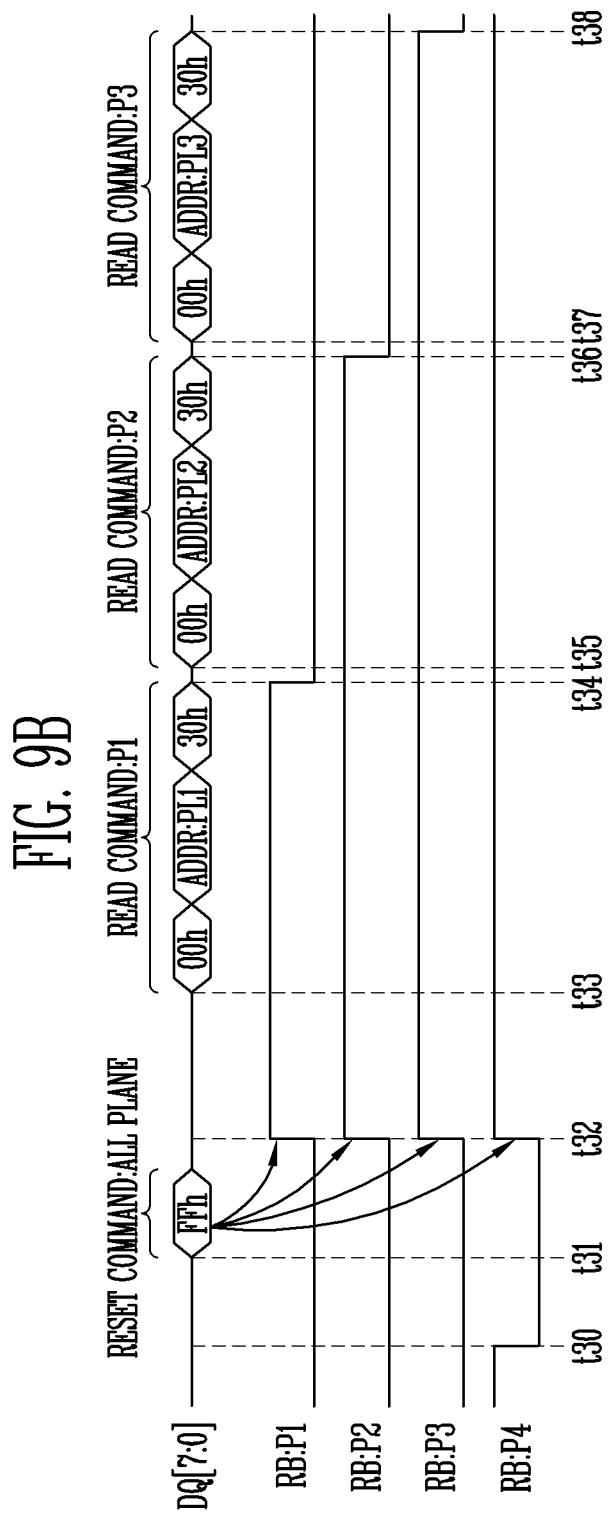

FIGS. 9A and 9B are timing diagrams illustrating the operation of the semiconductor memory device when the all-plane-reset command is received during the plane interleaving operation.

Referring to FIG. 9A, at a time point t21, the semiconductor memory device 1100 may receive the first page-read command through the DQ[7:0] pad, and at a time point t22, the semiconductor memory device 1100 may receive the address ADDR:P1 of the page included in the first plane P1.

At a time point t23, the semiconductor memory device 1100 may receive the second page-read command 30h through the DQ[7:0] pad.

As the second page-read command 30h is received, the read operation for the first plane P1 is started. Therefore, at a time point t24, the ready busy signal RB:P1 of the first plane P1 is changed from the high value indicating the ready state to the low value indicating the busy state.

At a time point t25, the semiconductor memory device 1100 may receive the first page-read command 00h through the DQ[7:0] pad, and may receive the address ADDR:P2 corresponding to the page included in the second plane P2, and the second page-read command 30h. The first page-read command 00h, the page address ADDR:P2, and the second page-read command 30h received between the time points t25 and t26 may configure the read command for the second plane P2.

As the second page-read command 30h is received, the read operation for the second plane P2 is performed. Therefore, at a time point t26, the ready busy signal RB:P2 of the second plane P2 is changed from the high value indicating the ready state to the low value indicating the busy state.

At a time point t27, the semiconductor memory device 1100 may receive the first page-read command 00h through the DQ[7:0] pad, and may receive the address ADDR:P3 corresponding to the page included in the third plane P3, and the second page-read command 30h. The first page-read command 00h, the page address ADDR:P3, and the second page-read command 30h received between the time points t27 and t28 may configure the read command for the third plane P3.

As the second page-read command 30h is received, the read operation for the third plane P3 is performed. Therefore, at a time point t28, the ready busy signal RB:P3 of the third plane P3 is changed from the high value indicating the ready state to the low value indicating the busy state.

At a time point t29, the semiconductor memory device 1100 may receive the first page-read command 00h through the DQ[7:0] pad, and may receive the address ADDR:P4 corresponding to the page included in the fourth plane P4, and the second page-read command 30h. The first page-read command 00h, the page address ADDR:P4, and the second page-read command 30h received between the time points t29 and t30 may configure the read command for the fourth plane P4.

As the second page-read command 30h is received, the read operation for the fourth plane P4 is performed. Therefore, at a time point t30, the ready busy signal RB:P4 of the fourth plane P4 is changed from the high value indicating the ready state to the low value indicating the busy state.

Referring to FIG. 9B (after time point t30 of FIG. 9A), at a time point t31, the semiconductor memory device 1100 may receive the operation reset command. In a specific situation, the controller 1200 may determine to correct the plane interleaving operation for a specific plane. For example, it may be required to change the page address in the second plane P2 and then perform the plane interleaving operation on the second plane P2 again. In this case, the controller 1200 may transmit the operation reset command to the semiconductor memory device 1100 performing the read operation through the plane interleaving scheme. In FIG. 9B, the operation reset command transmitted from the controller 1200 to the semiconductor memory device 1100 may be the "all-plane-reset command". The all-plane-reset command may be a command for controlling the semiconductor memory device 1100 to reset the plane interleaving operation for all planes included in the memory cell array 100. In an embodiment, the all-plane-reset command may be illustrated as FFh in FIG. 9B.

As the all-plane-reset command FFh is received, at a time point t32, the plane interleaving operation for all planes P1, P2, P3, and P4 of the semiconductor memory device 1100 may be reset. Therefore, at the time point t32, the ready busy signal RB:P1, RB:P2, RB:P3, and RB:P4 for all planes P1, P2, P3, and P4 may be changed from the low state to the high state.

Thereafter, at a time point t33, the controller 1200 may transmit the read command for the first plane P1 again. An address ADDR:P1 transmitted between the time points t33 and t34 may be the same address as the address ADDR:P1 transmitted during the period t22 and t23 or may be different from the address ADDR:P1. At a time point t34, the read operation for the first plane P1 of the semiconductor memory device 1100 is started. In addition, at a time point t35, the controller 1200 may transmit the read command for the second plane P2 again. Therefore, at a time point t36, the read operation for the second plane P2 of the semiconductor memory device 1100 is started. Similarly, an address ADDR:P2 transmitted between the time points t35 and t36 may be different from the address ADDR:P2 transmitted between the time points t25 and t26. Meanwhile, at a time point t37, the controller 1200 may transmit the read command for the third plane P3 again. Therefore, at a time point t38, the read operation for the third plane P3 of the semiconductor memory device 1100 is started. Although not shown in FIG. 9B, after the time point t38, the read command for the fourth plane P4 may also be transmitted again.

Referring to FIGS. 9A and 9B, during the plane interleaving operation, the controller 1200 may transmit the all-plane-reset command FFh to the semiconductor memory device 1100. In this case, the semiconductor memory device 1100 may reset the plane interleaving operation for all planes P1, P2, P3, and P4. Thereafter, the controller 1200 may sequentially transmit the read commands to the semiconductor memory device 1100 to control the semiconductor memory device 1100 to perform the plane interleaving operation again from the beginning.

However, according to the embodiment shown in FIGS. 9A and 9B, it is required to reset the plane interleaving operation on all planes and start the plane interleaving operation from the beginning even when the plane interleaving operation operating only on a selected plane (for example, P2) is required to be reset. Therefore, the completion of the plane interleaving operation on remaining planes (for example, P1, P3, and P4) is delayed, and thus an overall operation speed of the semiconductor memory device 1100 may be degraded.

In accordance with the semiconductor memory device according to another embodiment of the present disclosure, the plane interleaving operation operating only on a selected plane (for example, P2) may be reset. In this case, since the plane interleaving operation operating on the remaining planes keeps going despite the reset of the plane interleaving operation on the selected plane, the overall operation speed of the semiconductor memory device 1100 may be improved.

Figure 10B:
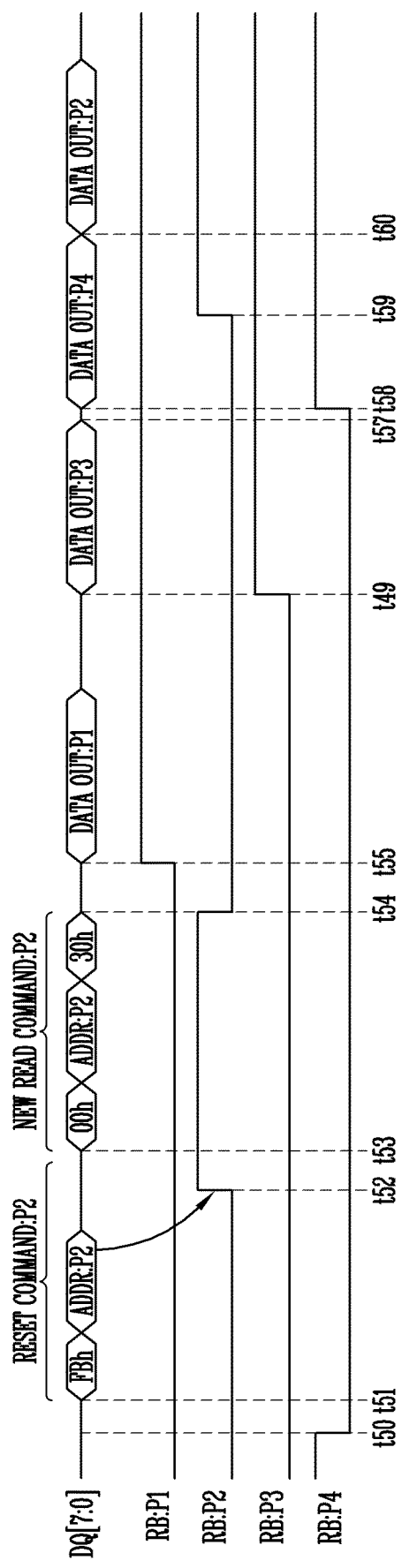

FIGS. 10A and 10B are timing diagrams illustrating the operation of the semiconductor memory device when the individual-plane-reset command is received during the plane interleaving operation.

Referring to FIG. 10A, at a time point t41, the semiconductor memory device 1100 may receive the first page-read command through the DQ[7:0] pad, and at a time point t42, the semiconductor memory device 1100 may receive the address ADDR:P1 of the page included in the first plane P1. At a time point t43, the semiconductor memory device 1100 may receive the second page-read command 30h through the DQ[7:0] pad.

As the second page-read command 30h is received, the read operation for the first plane P1 is started. Therefore, at a time point t44, the ready busy signal RB:P1 of the first plane P1 is changed from the high value indicating the ready state to the low value indicating the busy state.

At a time point t45, the semiconductor memory device 1100 may receive the first page-read command 00h through the DQ[7:0] pad, and may receive the address ADDR:P2 corresponding to the page included in the second plane P2, and the second page-read command 30h. The first page-read command 00h, the page address ADDR:P2, and the second page-read command 30h received between the time points t45 and t46 may configure the read command for the second plane P2.

As the second page-read command 30h is received, the read operation for the second plane P2 is performed. Therefore, at a time point t46, the ready busy signal RB:P2 of the second plane P2 is changed from the high value indicating the ready state to the low value indicating the busy state.

At a time point t47, the semiconductor memory device 1100 may receive the first page-read command 00h through the DQ[7:0] pad, and may receive the address ADDR:P3 corresponding to the page included in the third plane P3, and the second page-read command 30h. The first page-read command 00h, the page address ADDR:P3, and the second page-read command 30h received between the time points t47 and t48 may configure the read command for the third plane P3.

As the second page-read command 30h is received, the read operation for the third plane P3 is performed. Therefore, at a time point t48, the ready busy signal RB:P3 of the third plane P3 is changed from the high value indicating the ready state to the low value indicating the busy state.

At a time point t49, the semiconductor memory device 1100 may receive the first page-read command 00h through the DQ[7:0] pad, and may receive the address ADDR:P4 corresponding to the page included in the fourth plane P4, and the second page-read command 30h. The first page-read command 00h, the page address ADDR:P4, and the second page-read command 30h received between the time points t49 and t50 may configure the read command for the fourth plane P4.

As the second page-read command 30h is received, the read operation for the fourth plane P4 is performed. Therefore, at a time point t50, the ready busy signal RB:P4 of the fourth plane P4 is changed from the high value indicating the ready state to the low value indicating the busy state.

Referring to FIG. 10B (after time point t49 of FIG. 10A), at a time point t51, the semiconductor memory device 1100 may receive the operation reset command. In a specific situation, the controller 1200 may determine to correct the plane interleaving operation for a specific plane. For example, it may be required to change the page address in the second plane P2 and then perform the plane interleaving operation again. In this case, the controller 1200 may transmit the operation reset command to the semiconductor memory device 1100 performing the read operation through the plane interleaving scheme. In FIG. 10B, the operation reset command transmitted from the controller 1200 to the semiconductor memory device 1100 may be the "individual-plane-reset command". The individual-plane-reset command may be a command for controlling the semiconductor memory device 1100 to reset the plane interleaving operation for the plane P2 indicated by a specific address among the planes included in the memory cell array 100. The specific address may be provided along with the individual-plane-reset command. In an embodiment, the individual-plane-reset command may be illustrated as FBh in FIG. 10B. After the individual-plane-reset command FBh is transmitted, an address ADDR:P2 indicating the plane to be reset may be transmitted. The address ADDR:P2 transmitted between the time points t51 and t52 may indicate the plane P2 on which the plane interleaving operation is to be reset, and may not include a block address or a page address.

As the individual-plane-reset command FBh and the address ADDR:P2 are received, at a time point t52, the plane interleaving operation for the second plane P2 is reset. Therefore, the ready busy signal RB:P2 of the second plane P2 is changed from the low state to the high state. Since the ready busy signal of the second plane P2 indicates the high state, the controller 1200 may transmit a new read command for the second plane P2 again. Therefore, at a time point t54, a new read operation for the second plane P2 is started in response to the new read command, and the ready busy signal RB:P2 of the second plane P2 is changed from the high state to the low state.

As shown in FIG. 10B, when the individual-plane-reset command for the second plane P2 is received, the read operation (i.e., the plane interleaving operation) for the other planes P1, P3, and P4 keeps going. Therefore, at a time point t55, the read operation for the first plane P1 may be completed. Thus, at the time point t55, the data output operation DATA OUT:P1 of the first plane P1 is started.

Thereafter, at a time point t56, the read operation for the third plane P3 may be completed. Therefore, between the time points t56 and t57, the data output operation DATA OUT:P3 of the third plane P3 is performed. Similarly, at a time point t58, the read operation for the fourth plane P4 may be completed. Therefore, between the time points t58 and t60, the data output operation DATA OUT:P4 of the fourth plane P4 may be performed.

Meanwhile, at a time point t59, the read operation for the second plane P2 may be completed. Since the data output operation DATA OUT:P4 of the fourth plane P4 is still performed at the time point t59, the data output operation of the second plane P2 is not started. At a time point t60 when the data output operation DATA OUT:P4 of the fourth plane P4 is completed, the data output operation DATA OUT:P2 of the second plane P2 is started.

Referring to FIGS. 10A and 10B, during the plane interleaving operation, the controller 1200 may transmit the individual-plane-reset command for resetting the plane interleaving operation of the selected plane, to the semiconductor memory device 1100. In response to the individual-plane-reset command, the semiconductor memory device 1100 may reset the plane interleaving operation on the selected plane. Thereafter, the controller 1200 may transmit a new command to the semiconductor memory device 1100 to perform an operation for the reset plane. In this process, the plane interleaving operation for the other planes are not reset. Therefore, the operation speed of the semiconductor memory device 1100 is improved.

Figure 11:
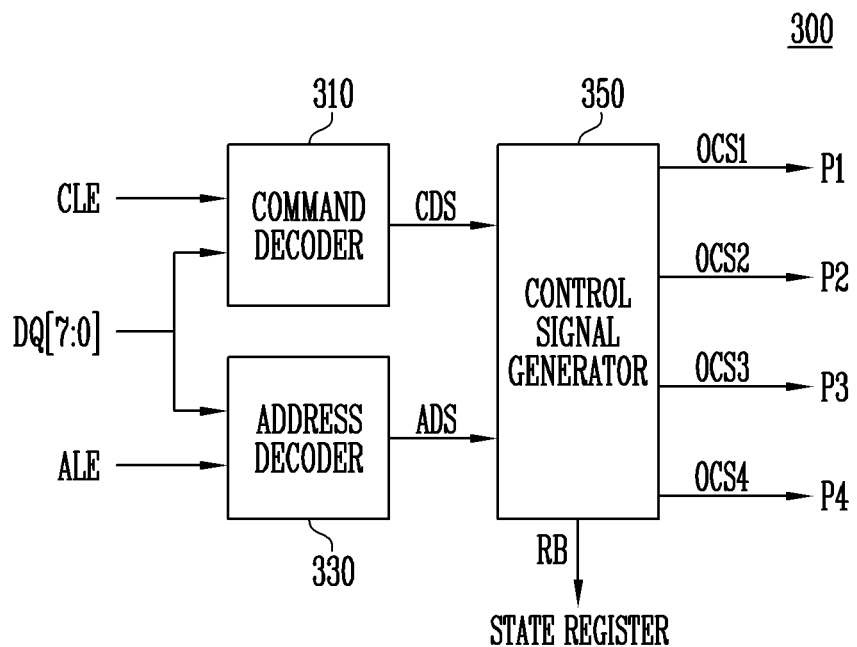
FIG. 11 is a block diagram illustrating a control logic, such as that shown in FIG. 3, according to an embodiment of the present disclosure.

FIG. 11 is a block diagram illustrating an embodiment of the control logic 300 of FIG. 3.

Referring to FIG. 11, the control logic 300 includes a command decoder 310, an address decoder 330, and a control signal generator 350.

The command decoder 310 may receive the command transferred through the DQ[7:0] pad, based on the command latch enable signal received through the CLE pad. The command decoder 310 transfers a command decoding signal CDS generated by decoding the received command to the control signal generator 350. When the command received by the command decoder 310 is the operation reset command, the command decoding signal CDS may be a signal indicating whether the operation reset command is the all-plane-reset command or the individual-plane-reset command.

The address decoder 330 may receive the address transferred through the DQ[7:0] pad, based on the address latch enable signal received through the ALE pad. The address decoder 330 transfers an address decoding signal ADS generated by decoding the received address to the control signal generator 350. The address decoding signal ADS may be a signal indicating a plane address, a block address, a page address, and the like included in the received address.

When the command received by the command decoder 310 is the all-plane-reset command, the address decoder 330 may not receive an address corresponding to the command. Meanwhile, when the command received by the command decoder 310 is the individual reset command, the address decoder 330 may transfer the address decoding signal ADS indicating a plane corresponding to the command to the control signal generator 350.

The control signal generator 350 may generate operation control signals OCS1, OCS2, OCS3, and OCS4 for respectively controlling the operations for the plurality of planes P1, P2, P3, and P4, based on the received command decoding signal CDS and address decoding signal ADS. The operation control signals OCS1, OCS2, OCS3, and OCS4 may be transferred to the peripheral circuits 200 shown in FIG. 3 to control the operations for each of the planes included in the memory cell array 100. The first operation control signal OCS1 may be a signal for controlling the operation of the first plane P1. The second operation control signal OCS2 may be a signal for controlling the operation of the second plane P2. The third operation control signal OCS3 may be a signal for controlling the operation of the third plane P3. The fourth operation control signal OCS4 may be a signal for controlling the operation of the fourth plane P4.

Meanwhile, the control signal generator 350 may generate the ready busy signal RB for each of the planes P1, P2, P3, and P4 and transfer the ready busy signal RB to the state register 400.

When the command decoding signal CDS received from the command decoder 310 indicates the all-plane-reset command, the control signal generator 350 may generate the operation control signals OCS1, OCS2, OCS3, and OCS4 for resetting all of the first to fourth planes P1, P2, P3, and P4. Meanwhile, the control signal generator 350 may generate the ready busy signal RB having the high value with respect to the first to fourth planes P1, P2, P3, and P4 and output the generated ready busy signal RB to the state register 400.

When the command decoding signal CDS received from the command decoder 310 indicates the individual-plane-reset command, the control signal generator 350 determines the plane to be reset, based on the address decoding signal ADS received from the address decoder 330. For example, when the address decoding signal ADS is a signal indicating the second plane P2, the control signal generator 350 may generate the operation control signal OCS2 for resetting the second plane P2. Meanwhile, the control signal generator 350 may generate the ready busy signal RB2 having the high value with respect to the second plane P2 and output the generated ready busy signal RB2 to the state register 400.

Figure 12:
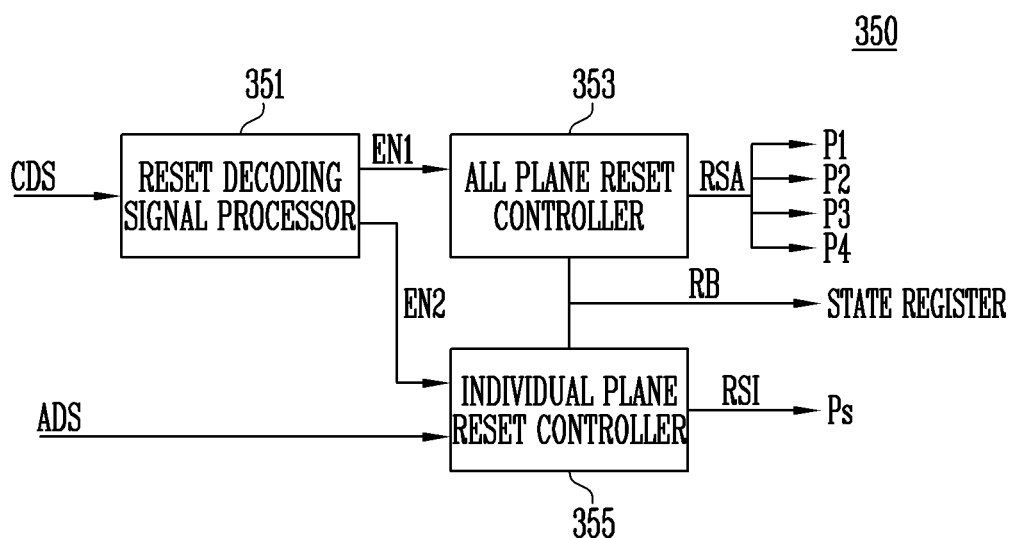
FIG. 12 is a block diagram illustrating a control signal generator, such as that shown in FIG. 11, according to an embodiment of the present disclosure.

FIG. 12 is a block diagram illustrating an embodiment of the control signal generator 350 shown in FIG. 11. Referring to FIG. 12, the control signal generator 350 includes a reset decoding signal processor 351, an all-plane-reset controller 353, and an individual-plane-reset controller 355.

The reset decoding signal processor 351 receives the command decoding signal CDS from the command decoder 310. When the command received by the command decoder 310 is the operation reset command, the command decoding signal CDS output from the command decoder 310 may be a signal indicating whether the operation reset command is the all-plane-reset command or the individual-plane-reset command.

As a result of analyzing the command decoding signal CDS, when the received command is the all-plane-reset command, the reset decoding signal processor 351 generates a first activation signal EN1. The first activation signal EN1 is transferred to the all-plane-reset controller 353. The all-plane-reset controller 353 may be activated by the first activation signal EN1.

As a result of analyzing the command decoding signal CDS, when the received command is the individual-plane-reset command, the reset decoding signal processor 351 generates a second activation signal EN2. The second activation signal EN2 is transferred to the individual-plane-reset controller 355. The individual-plane-reset controller 355 may be activated by the second activation signal EN2.

The all-plane-reset controller 353 receives the first activation signal EN1 and generates an all-plane-reset signal RSA for resetting the first to fourth planes P1, P2, P3, and P4. The all-plane-reset signal RSA may function as the first to fourth operation control signals OCS1, OCS2, OCS3, and OCS4 shown in FIG. 11. Meanwhile, the all-plane-reset controller 353 generates the ready busy signal RB having the high value with respect to the first to fourth planes P1, P2, P3, and P4 and outputs the generated ready busy signal RB to the state register 400.

The individual-plane-reset controller 355 receives the second activation signal EN2 and the address decoding signal ADS and generates a reset signal RSI for resetting any one of the first to fourth planes P1, P2, P3, and P4. The generated individual-plane-reset signal RSI may be a signal for resetting a plane Ps selected by the address decoding signal ADS. For example, when the address decoding signal ADS is a signal indicating the second plane P2, the selected plane Ps may be the second plane. In this case, the individual-plane-reset signal RSI may function as the second operation signal OCS2 for resetting the second plane P2. Meanwhile, the individual-plane-reset controller 355 generates the ready busy signal RB having the high value with respect to the selected plane Ps and outputs the generated ready busy signal RB to the state register 400. For example, when the address decoding signal ADS is a signal indicating the second plane P2, the individual-plane-reset controller 355 generates the ready busy signal RB having the high value with respect to the second plane P2 and outputs the generated ready busy signal RB to the state register 400.

Figure 13:
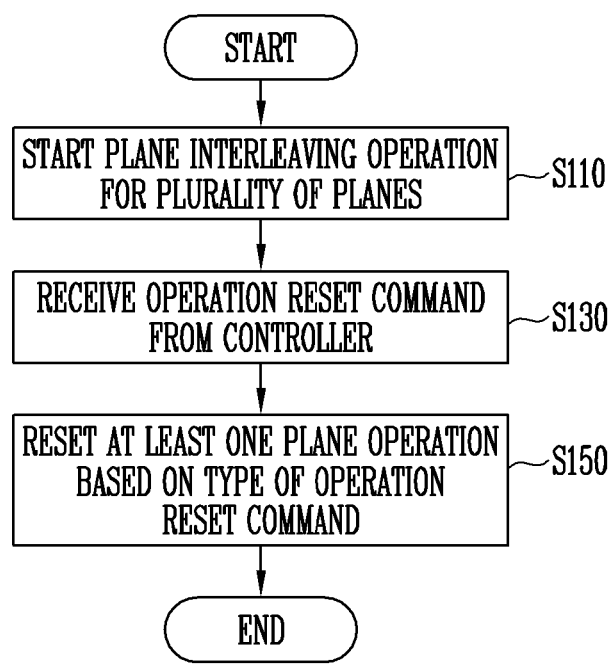
FIG. 13 is a flowchart illustrating a method of operating a semiconductor memory device according to an embodiment of the present disclosure.

FIG. 13 is a flowchart illustrating a method of operating a semiconductor memory device according to an embodiment of the present disclosure.

Referring to FIG. 13, the semiconductor memory device 1100 starts the plane interleaving operation for the plurality of planes based on commands received from the controller 1200 (S110). The plane interleaving operation being performed in step S110 may be the read operation as shown in FIGS. 8A, 9A, and 10A.

While the plane interleaving operation for the plurality of planes is performed, the semiconductor memory device 1100 receives the operation reset command from the controller 1200 (S130). The operation reset command may be one of the all-plane-reset command or the individual-plane-reset command.

The semiconductor memory device resets at least one plane operation based on a type of the received operation reset command (S150). A more detailed embodiment of step S150 will be described later with reference to FIG. 14.

Figure 14:
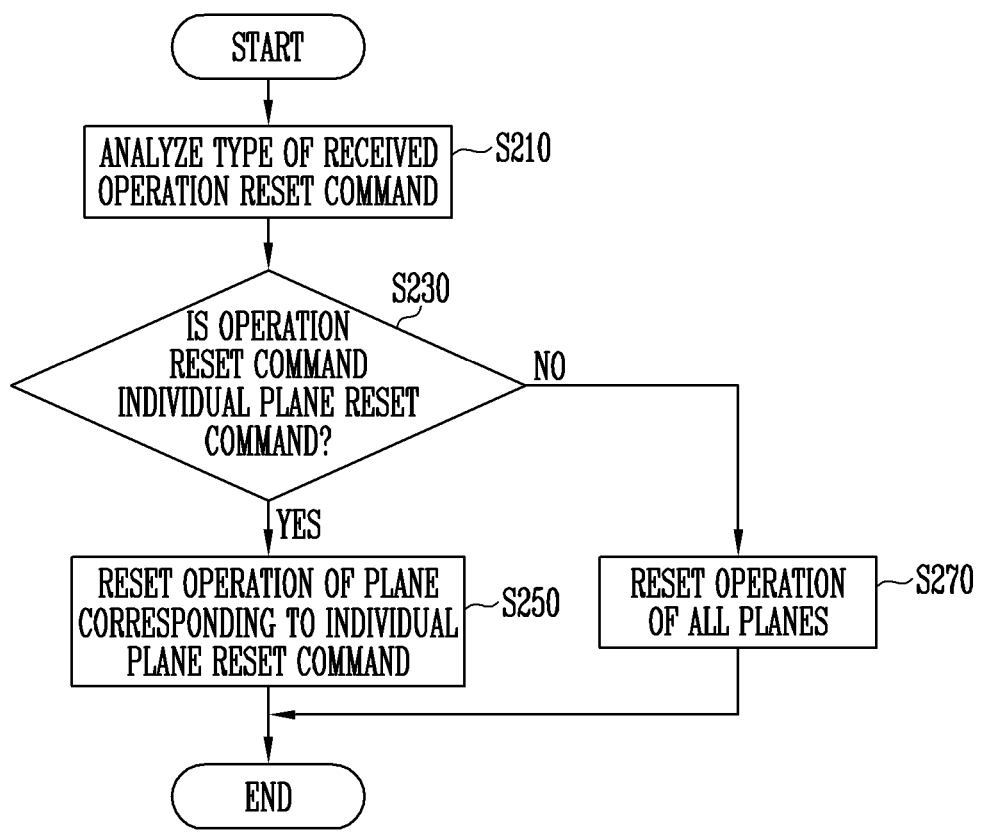
FIG. 14 is a flowchart illustrating a more detailed embodiment of step S150 shown in FIG. 13.

FIG. 14 is a flowchart illustrating a more detailed embodiment of step S150 shown in FIG. 13.

In step S210, the type of the received operation reset command is analyzed. Step S210 may be performed by the command decoder 310 of FIG. 11. The command decoder 310 generates the command decoding signal CDS by decoding the received operation reset command. The generated command decoding signal CDS may be transferred to the control signal generator 350.

In step S230, it is determined whether the received operation reset command is the individual-plane-reset command. Step S230 may be performed by the control signal generator 350. The control signal generator 350 determines whether the received operation reset command is the individual-plane-reset command based on the command decoding signal CDS.

When the received operation reset command is the individual-plane-reset command (S230: YES), the control signal generator 350 generates the operation control signal (for example, OCS2) for resetting the plane interleaving operation on a selected plane (for example, P2) corresponding to the address decoding signal received from the address decoder 330. Therefore, the plane interleaving operation on the selected plane may be reset in response to the individual-plane-reset command and the address decoding signal (S250).

When the received operation reset command is the all-plane-reset command (S230: NO), the control signal generator 350 generates the operation control signals OCS1, OCS2, OCS3, and OCS4 for resetting the plane interleaving operation for all planes P1, P2, P3, and P4. Therefore, the plane interleaving operation for all planes may be reset in response to the all-plane-reset command (S270).

As described above, in accordance with the semiconductor memory device according to an embodiment of the present disclosure, the operations of all planes are reset or only the operation of the selected plane is reset according to the type of the operation reset command received during the plane interleaving operation. When the operation of the selected plane is reset, since the operation of the remaining planes is continuously performed, the overall operation speed of the semiconductor memory device may be improved.

Figure 15:
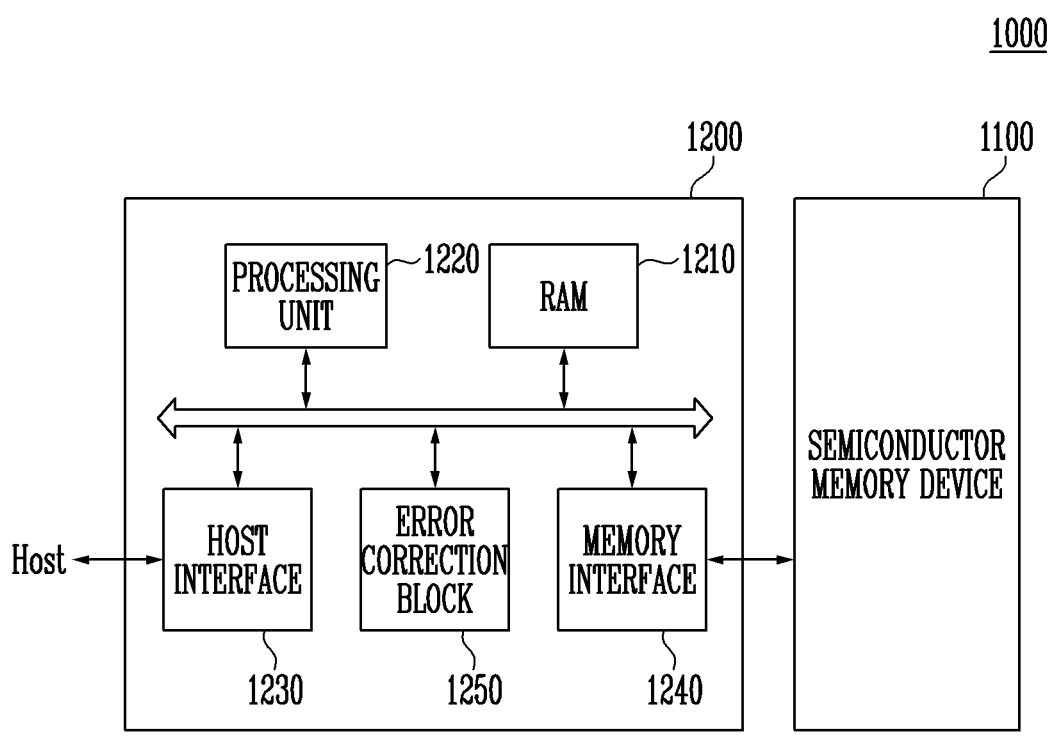
FIG. 15 is a block diagram illustrating a memory system including the semiconductor memory device of FIG. 3.

FIG. 15 is a block diagram illustrating a memory system including the semiconductor memory device of FIG. 3.

Referring to FIG. 15, the memory system 1000 includes the semiconductor memory device 1100 and the controller 1200. The semiconductor memory device 1100 may be the semiconductor memory device described with reference to FIG. 1. Hereinafter, a repetitive description will be omitted.

The controller 1200 is connected to the host Host and the semiconductor memory device 1100. The controller 1200 is configured to access the semiconductor memory device 1100 in response to a request from the host Host. For example, the controller 1200 is configured to control the read operation, the write operation, and a background operation of the semiconductor memory device 1100. The controller 1200 is configured to provide an interface between the semiconductor memory device 1100 and the host Host. The controller 1200 is configured to drive firmware for controlling the semiconductor memory device 1100.

The controller 1200 includes a random access memory (RAM) 1210, a processing unit 1220, a host interface 1230, a memory interface 1240, and an error correction block 1250. The RAM 1210 is used as at least one of an operation memory of the processing unit 1220, a cache memory between the semiconductor memory device 1100 and the host Host, and a buffer memory between the semiconductor memory device 1100 and the host Host. The processing unit 1220 controls all operations of the controller 1200. In addition, the controller 1200 may temporarily store program data provided from the host Host during a write operation.

The host interface 1230 includes a protocol for performing data exchange between the host Host and the controller 1200. As an embodiment, the controller 1200 is configured to communicate with the host Host through at least one of various interface protocols such as a universal serial bus (USB) protocol, a multimedia card (MMC) protocol, a peripheral component interconnection (PCI) protocol, a peripheral component interconnect-express (PCI-express) protocol, an advanced technology attachment (ATA) protocol, a serial ATA (SATA) protocol, a parallel ATA (PATA) protocol, a small computer small interface (SCSI) protocol, an enhanced small disk interface (ESDI) protocol, an integrated drive electronics (IDE) protocol, and a private protocol.

The memory interface 1240 interfaces with the semiconductor memory device 1100. For example, the memory interface includes a NAND interface or a NOR interface.

The error correction block 1250 is configured to detect and correct an error of data received from the semiconductor memory device 1100 using an error correcting code (ECC). The processing unit 1220 will control the semiconductor memory device 1100 to adjust a read voltage and perform the read operation again in accordance with an error detection result of the error correction block 1250. As an embodiment, the error correction block 1250 may be provided as a component of the controller 1200.

The controller 1200 and the semiconductor memory device 1100 may be integrated into one semiconductor device. As an embodiment, the controller 1200 and the semiconductor memory device 1100 may be integrated into one semiconductor device to form a memory card. For example, the controller 1200 and the semiconductor memory device 1100 may be integrated into one semiconductor device to form a memory card such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and a universal flash storage (UFS).

The controller 1200 and the semiconductor memory device 1100 may be integrated into one semiconductor device to form a semiconductor drive (solid state drive (SSD)). The semiconductor drive (SSD) includes a storage device configured to store data in a semiconductor memory. When the memory system 1000 is used as the semiconductor drive (SSD), an operation speed of the host Host connected to the memory system 1000 is dramatically improved.

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

As an embodiment, the semiconductor memory device 1100 or memory system 1000 may be mounted as a package of various types. For example, the semiconductor memory device 1100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline (SOIC), a shrink small outline package (SSOP), a thin small outline (TSOP), a system in package (SIP), a multi-chip package (MCP), a wafer-level fabricated package (WFP), or a wafer-level processed stack package (WSP).

Figure 16:
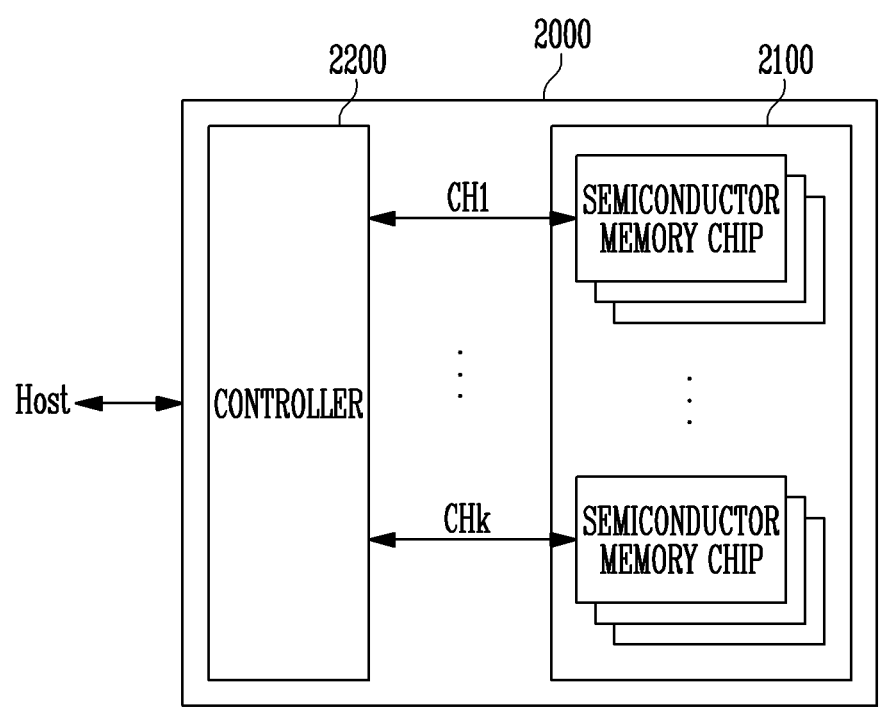
FIG. 16 is a block diagram illustrating an application example of the memory system of FIG. 15.

FIG. 16 is a block diagram illustrating an application example of the memory system of FIG. 15.

Referring to FIG. 16, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 16, the plurality of groups communicate with the controller 2200 through first to k-th channels CH1 to CHk, respectively. Each semiconductor memory chip is configured and is operated similarly to the semiconductor memory device 1100 described with reference to FIG. 1.

Each group is configured to communicate with the controller 2200 through one common channel. The controller 2200 is configured similarly to the controller 1200 described with reference to FIG. 15 and is configured to control the plurality of memory chips of the semiconductor memory device 2100 through the plurality of channels CH1 to CHk.

Figure 17:
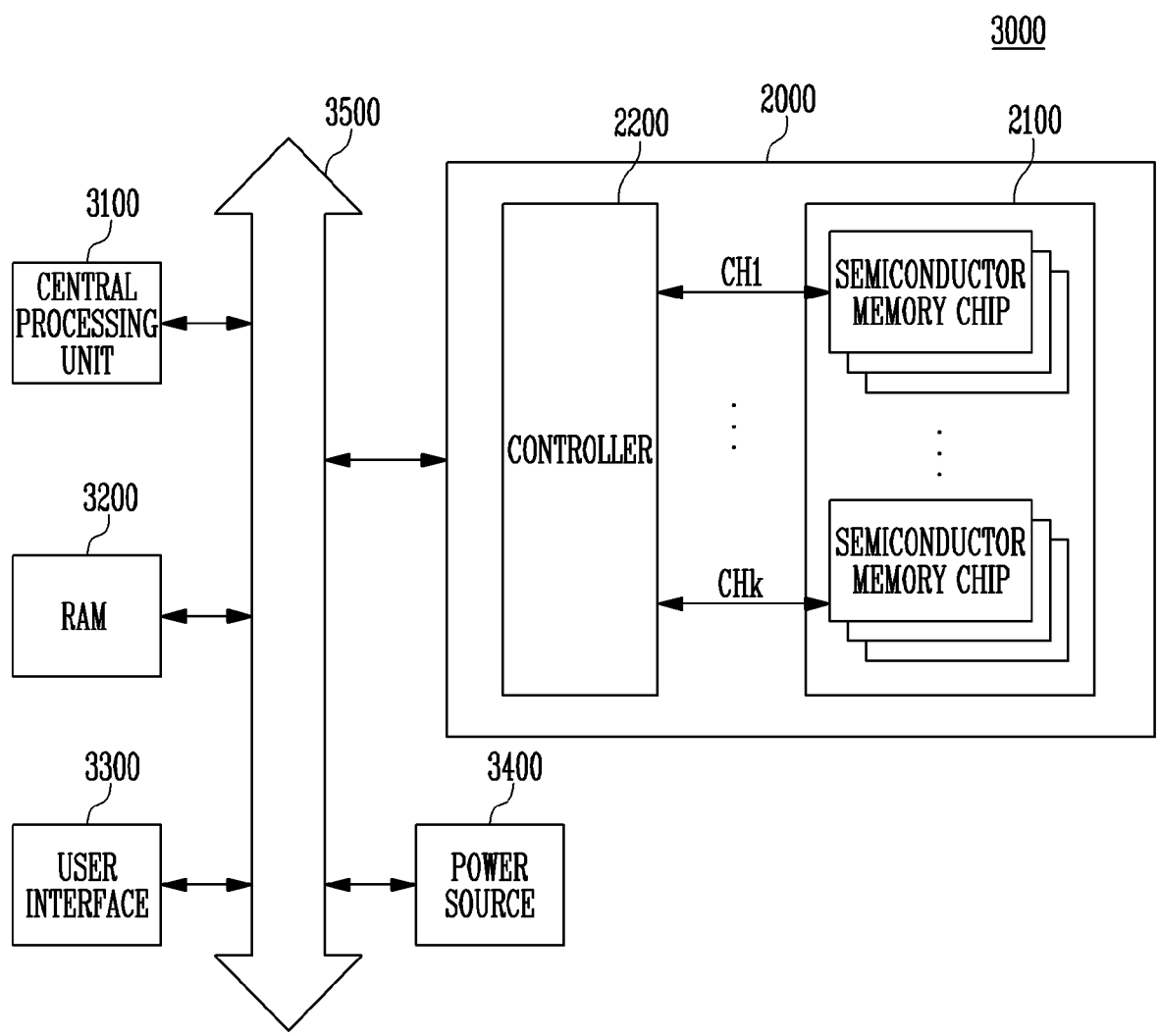
FIG. 17 is a block diagram illustrating a computing system including the memory system described with reference to FIG. 16.

FIG. 17 is a block diagram illustrating a computing system including the memory system described with reference to FIG. 16.

The computing system 3000 includes a central processing device 3100, a random access memory (RAM) 3200, a user interface 3300, a power source 3400, a system bus 3500, and the memory system 2000.

The memory system 2000 is electrically connected to the central processing device 3100, the RAM 3200, the user interface 3300, and the power source 3400 through the system bus 3500. Data provided through the user interface 3300 or processed by the central processing device 3100 is stored in the memory system 2000.

In FIG. 17, the semiconductor memory device 2100 is connected to the system bus 3500 through the controller 2200. However, the semiconductor memory device 2100 may be configured to be directly connected to the system bus 3500. At this time, a function of the controller 2200 is performed by the central processing device 3100 and the RAM 3200.

In FIG. 17, the memory system 2000 described with reference to FIG. 16 is provided. However, the memory system 2000 may be replaced with the memory system 1000 described with reference to FIG. 15. As an embodiment, the computing system 3000 may be configured to include both of the memory systems 1000 and 2000 described with reference to FIGS. 15 and 16.

The embodiments of the present disclosure disclosed in the present specification and drawings are merely examples for describing the technical content of the present disclosure and facilitating understanding of the present disclosure and do not limit the scope of the present disclosure. It will be apparent to a person skilled in the art to which the present disclosure pertains that other modifications based on the technical spirit of the present disclosure may be carried out in addition to the embodiments disclosed herein.

What is claimed is:

1. A semiconductor memory device comprising:
a memory cell array including a plurality of planes;
a peripheral circuit configured to perform a plane interleaving operation for the plurality of planes; and
a control logic configured to control the peripheral circuit to reset the plane interleaving operation for all of the plurality of planes or a selected plane of the plurality of planes, based on a type of an operation reset command received by the control logic.

2. The semiconductor memory device of claim 1, wherein, when the type of the operation reset command is an all-plane-reset command, the control logic controls the peripheral circuit to reset the plane interleaving operation for all of the plurality of planes.

3. The semiconductor memory device of claim 1, wherein, when the type of the operation reset command is an individual-plane-reset command, the control logic controls the peripheral circuit to reset the plane interleaving operation for the selected plane corresponding to the individual-plane-reset command.

4. The semiconductor memory device of claim 1, wherein the control logic comprises:
a command decoder configured to decode the operation reset command to generate a command decoding signal indicating the type of the received operation reset command; and
a control signal generator configured to generate an operation control signal for controlling the peripheral circuit to reset the plane interleaving operation for the at least one plane, based on the command decoding signal.

5. The semiconductor memory device of claim 4, wherein the control signal generator generates the operation control signal for controlling the peripheral circuit to reset the plane interleaving operation for all of the plurality of planes, in response to the command decoding signal indicating that the operation reset command is an all-plane-reset command.

6. The semiconductor memory device of claim 5, wherein the control signal generator comprises:
a reset decoding signal processor configured to receive the command decoding signal and generate a first activation signal; and
an all-plane-reset controller configured to generate an all-plane-reset signal for controlling the peripheral circuit to reset the plane interleaving operation for all of the plurality of planes, in response to the first activation signal.

7. The semiconductor memory device of claim 4, wherein the control logic further comprises an address decoder configured to receive an address, and decode the address to generate an address decoding signal indicating a plane corresponding to the operation reset command.

8. The semiconductor memory device of claim 7, wherein the control signal generator generates the operation control signal for controlling the peripheral circuit to reset the plane interleaving operation for the plane indicated by the address decoding signal, in response to the command decoding signal indicating that the operation reset command is an individual-plane-reset command.

9. The semiconductor memory device of claim 8, wherein the control signal generator comprises:
 a reset decoding signal processor configured to receive the command decoding signal and generate a second activation signal; and
 an individual-plane-reset controller configured to generate an individual-plane-reset signal for controlling the peripheral circuit to reset the plane interleaving operation for the plane indicated by the address decoding signal, in response to the second activation signal.

10. The semiconductor memory device of claim 1, further comprising a state register configured to store data indicating a busy state for each of the plurality of planes while the plane interleaving operation is performed, and store data indicating a ready state for each of at least one reset plane when the plane interleaving operation for the at least one plane is reset.

11. The semiconductor memory device of claim 10, wherein after the state of the at least one reset plane is changed to the ready state, the control logic is further configured to receive an additional operation command for the at least one reset plane.

12. The semiconductor memory device of claim 11, wherein the control logic is further configured to control the peripheral circuit to perform the plane interleaving operation for the plurality of planes based on the additional operation command.

13. A method of operating a semiconductor memory device including a plurality of planes, the method comprising:
 starting a plane interleaving operation for the plurality of planes;
 receiving an operation reset command from a controller; and
 resetting the plane interleaving operation for all of the plurality of planes or a selected plane of the plurality of planes, based on a type of the operation reset command.

14. The method of claim 13, wherein starting the plane interleaving operation comprises:
 starting the plane interleaving operation for a first plane of the plurality of planes; and
 starting the plane interleaving operation for a second plane different from the first plane of the plurality of planes before the plane interleaving operation for the first plane is completed.

15. The method of claim 13, wherein resetting the plane interleaving operation for the at least one plane of the plurality of planes comprises:
 analyzing the type of the operation reset command; and
 resetting the plane interleaving operation for all of the plurality of planes when the operation reset command is an all-plane-reset command.

16. The method of claim 13, wherein resetting the operation of the at least one plane of the plurality of planes comprises:
 analyzing the type of the operation reset command; and
 resetting the plane interleaving operation for the selected plane corresponding to an individual-plane-reset command, when the operation reset command is the individual-plane-reset command.

17. The method of claim 16, wherein receiving the operation reset command from the controller comprises receiving an address indicating the plane corresponding to the individual-plane-reset command.

18. The method of claim 16, further comprising receiving an operation command corresponding to the reset plane.

19. The method of claim 16, wherein planes except for the reset plane continuously perform the plane interleaving operation.

* * * * *